(12) United States Patent
Randhawa et al.

(10) Patent No.: US 10,985,039 B2
(45) Date of Patent: Apr. 20, 2021

(54) SUB-NANOMETER-LEVEL SUBSTRATE CLEANING MECHANISM

(71) Applicant: Planar Semiconductor, Inc., Milpitas, CA (US)

(72) Inventors: Rubinder S. Randhawa, Dublin, CA (US); Harry Christov, Campbell, CA (US)

(73) Assignee: Planar Semiconductor, Inc., Milpitas, CA (US)

( * ) Notice: Subject to any disclaimer, the term of this patent is extended or adjusted under 35 U.S.C. 154(b) by 0 days.

(21) Appl. No.: 16/478,337

(22) PCT Filed: Jan. 30, 2018

(86) PCT No.: PCT/US2018/015924
§ 371 (c)(1),
(2) Date: Jul. 16, 2019

(87) PCT Pub. No.: WO2018/144446
PCT Pub. Date: Aug. 9, 2018

(65) Prior Publication Data
US 2019/0371629 A1 Dec. 5, 2019

Related U.S. Application Data

(60) Provisional application No. 62/518,277, filed on Jun. 12, 2017, provisional application No. 62/455,425, filed on Feb. 6, 2017.

(51) Int. Cl.
*H01L 21/02* (2006.01)
*H01L 21/67* (2006.01)
(Continued)

(52) U.S. Cl.
CPC .. *H01L 21/67051* (2013.01); *H01L 21/02054* (2013.01); *H01L 21/6733* (2013.01); *H01L 21/67034* (2013.01); *H01L 21/68764* (2013.01)

(58) Field of Classification Search
None
See application file for complete search history.

(56) References Cited

U.S. PATENT DOCUMENTS 3,849,906 A  11/1974  Hansen et al.
5,531,857 A  7/1996  Engelsberg et al.
(Continued)

FOREIGN PATENT DOCUMENTS

CN  1679143 A  10/2005
CN  101540268 B  12/2012
(Continued)

OTHER PUBLICATIONS

"Korean Application Serial No. 10-2019-7026025, Notice of Preliminary Rejection dated Mar. 17, 2020", with English translation, 5 pages.
(Continued)

*Primary Examiner* — Mikhail Kornakov
*Assistant Examiner* — Ryan L. Coleman
(74) *Attorney, Agent, or Firm* — Schwegman Lundberg & Woessner, P.A.

(57) ABSTRACT

Various embodiments comprise apparatuses for cleaning and drying a substrate and methods of operating the apparatuses. In one embodiment, an exemplary apparatus includes a vertical substrate holder to hold and rotate the substrate at various speeds. An inner shield and an outer shield, when in a closed position, surround the vertical substrate holder during operation of the apparatus. Each of the inner shield and the outer shield can operate independently in at least one
(Continued)

of rotational speed and direction from the other shield. A front-side spray jet and a back-side spray jet are arranged to spray at least one fluid onto both sides of the substrate and edges of the substrate substantially concurrently. A gas flow, combined with a high rotational-speed of the shields and substrate, assist in drying the substrate. Additional apparatuses and methods of forming the apparatuses are disclosed.

30 Claims, 25 Drawing Sheets

(51) Int. Cl.
    *H01L 21/673* (2006.01)
    *H01L 21/687* (2006.01)

(56) References Cited

U.S. PATENT DOCUMENTS

| | | | |
|---|---|---|---|
| 6,225,235 | B1 | 5/2001 | Kunze-concewitz |
| 6,507,031 | B1 | 1/2003 | Jinbo et al. |
| 6,516,816 | B1 | 2/2003 | Husain et al. |
| 2003/0079762 | A1 | 5/2003 | Husain et al. |
| 2003/0106881 | A1 | 6/2003 | Lee et al. |
| 2004/0020520 | A1 | 2/2004 | Kim et al. |
| 2004/0224508 | A1 | 11/2004 | Engel et al. |
| 2005/0026455 | A1 | 2/2005 | Hamada et al. |
| 2005/0170653 | A1 | 8/2005 | Horiuchi et al. |
| 2006/0042666 | A1 | 3/2006 | Tsujimura |
| 2006/0174920 | A1 | 8/2006 | Randhawa |
| 2008/0252865 | A1 | 10/2008 | Nagasaka et al. |
| 2009/0032062 | A1 | 2/2009 | Randhawa et al. |
| 2009/0075060 | A1 | 3/2009 | Miller et al. |
| 2011/0083696 | A1 | 4/2011 | Nasr et al. |
| 2011/0139759 | A1 | 6/2011 | Millman, Jr. et al. |
| 2014/0154099 | A1 | 6/2014 | Sivaramakrishnan et al. |
| 2015/0059642 | A1 | 3/2015 | Furuya |
| 2019/0378729 | A1 | 12/2019 | Randhawa et al. |
| 2020/0219722 | A1 | 7/2020 | Randhawa et al. |

FOREIGN PATENT DOCUMENTS

| | | |
|---|---|---|
| CN | 110603628 | 12/2019 |
| CN | 110603629 | 12/2019 |
| CN | 110622290 | 12/2019 |
| JP | H04119524 | 4/1992 |
| JP | 07192996 A | 7/1995 |
| JP | H07192996 A | 7/1995 |
| JP | H1064864 | 3/1998 |
| JP | H10189499 | 7/1998 |
| JP | 10242098 A | 9/1998 |
| JP | H10242098 A | 9/1998 |
| JP | H1126410 | 1/1999 |
| JP | 2000124181 | 4/2000 |
| JP | 2001127033 A | 5/2001 |
| JP | 2007335868 A | 12/2007 |
| JP | 2009147061 | 7/2009 |
| JP | 2014504004 | 2/2014 |
| KR | 100749543 B1 | 8/2007 |
| KR | 100757848 B1 | 9/2007 |
| KR | 100787996 B1 | 12/2007 |
| TW | 201841235 A | 11/2018 |
| TW | 201842609 A | 12/2018 |
| WO | WO-2004061926 A1 | 7/2004 |
| WO | WO-2009075060 A1 | 6/2009 |
| WO | WO-2018144446 A1 | 8/2018 |
| WO | WO-2018145001 A1 | 8/2018 |
| WO | WO-2018145070 | 8/2018 |

OTHER PUBLICATIONS

"Korean Application Serial No. 10-2019-7026006, Notice of Preliminary Rejection dated Mar. 17, 2020", with English translation, 4 pages.

"European Application Serial No. 18747990.2, Response to Communication pursuant to Rules 161(2) and 162 EPC filed Apr. 16, 2020", 12 pages.

"European Application Serial No. 18748256.7, Response to Communication pursuant to Rules 161(2) and 162 EPC filed Apr. 16, 2020", 13 pages.

"European Application Serial No. 18748631.1, Response to Communication pursuant to Rules 161(2) and 162 EPC filed Apr. 16, 2020", 11 pages.

"U.S. Appl. No. 16/478,407, Non Final Office Action dated Apr. 22, 2020", 17 pages.

"U.S. Appl. No. 16/478,432, Restriction Requirement dated May 18, 2020", 6 pages.

"International Application Serial No. PCT/US2018/015924, International Preliminary Report Patentability dated May 31, 2019", 6 pgs.

"International Application Serial No. PCT/US2018/015924, International Search Report dated May 11, 2018", 3 pgs.

"International Application Serial No. PCT/US2018/015924, Written Opinion dated Mar. 27, 2019", 4 pgs.

"International Application Serial No. PCT/US2018/015924, Written Opinion dated May 11, 2018", 8 pgs.

"International Application Serial No. PCT/US2018/016860, International Preliminary Report on Patentability dated May 31, 2019", 6 pgs.

"International Application Serial No. PCT/US2018/016860, International Search Report dated May 14, 2018", 3 pgs.

"International Application Serial No. PCT/US2018/016860, Written Opinion dated May 14, 2018", 9 pgs.

"International Application Serial No. PCT/US2018/017014, International Preliminary Report Ion Patentability dated May 31, 2019", 6 pgs.

"International Application Serial No. PCT/US2018/017014, International Search Report dated May 18, 2018", 3 pgs.

"International Application Serial No. PCT/US2018/017014, Written Opinion dated Mar. 28, 2019", 4 pgs.

"International Application Serial No. PCT/US2018/017014, Written Opinion dated Mar. 18, 2019", 10 pgs.

U.S. Appl. No. 16/478,407, filed Jul. 16, 2019, Removal of Process Effluents.

U.S. Appl. No. 16/478,432, filed Jul. 16, 2019, Subnanaometer-Level Light-Based Substrate Cleaning.

"U.S. Appl. No. 16/478,407, Preliminary Amendment filed Jul. 16, 2019", 10 pages.

"U.S. Appl. No. 16/478,432, Preliminary Amendment filed Jul. 16, 2019", 8 pages.

"U.S. Appl. No. 16/478,407, Notice of Non-Compliant Amendment dated Feb. 27, 2020", 4 pages.

"U.S. Appl. No. 16/478,407, Response filed Mar. 4, 2020 to Notice of Non-Compliant Amendment dated Feb. 27, 2020", 12 pages.

"Japanese Application Serial No. 2019-563322, Notification of Reasons for Refusal dated Feb. 17, 2020", with English translation, 6 pages.

"Japanese Application Serial No. 2019-554554, Notification of Reasons for Refusal dated Feb. 17, 2020", with English translation, 6 pages.

"U.S. Appl. No. 16/478,407, Notice of Allowance dated Sep. 3, 2020", 8 pgs.

"U.S. Appl. No. 16/478,407, Response filed Aug. 24, 2020 to Non Final Office Action dated Apr. 22, 2020", 19 pgs.

"U.S. Appl. No. 16/478,432, Non Final Office Action dated Sep. 25, 2020", 17 pgs.

"U.S. Appl. No. 16/478,432, Response filed Sep. 17, 2020 to Restriction Requirement dated May 18, 2020", 7 pgs.

"Chinese Application Serial No. 201880023871.1, Office Action dated Jul. 23, 2020", with English translation, 10 pages.

"European Application Serial No. 18747990.2, Extended European Search Report dated Oct. 23, 2020", 7 pgs.

"European Application Serial No. 18748256.7, Extended European Search Report dated Oct. 27, 2020", 7 pgs.

"European Application Serial No. 18748631.1, Extended European Search Report dated Oct. 27, 2020", 8 pgs.

(56) References Cited

OTHER PUBLICATIONS

"Japanese Application Serial No. 2019-554554, Response filed Aug. 17, 2020 to Notification of for Refusal dated Feb. 17, 2020", with English claims, 9 pages.
"Japanese Application Serial No. 2019-563322, Response filed Aug. 17, 2020 to Notification of Reasons for Refusal dated Feb. 17, 2020", with English claims, 11 pages.
"Japanese Application Serial No. 2019-563336, Notification of Reasons for Refusal dated Oct. 26, 2020", with English translation, 11 pgs.
"Korean Application Serial No. 10-2019-7026006, Response filed Sep. 25, 2020 to Notice of Preliminary Rejection dated Mar. 17, 2020", with English claims, 18 pages.
"Chinese Application Serial No. 201880023871.1, Response filed Dec. 6, 2020 to Office Action dated Jul. 23, 2020", with English claims, 15 pages.
"U.S. Appl. No. 16/478,407, Notice of Allowability dated Dec. 17, 2020", 5 pages.

US 10,985,039 B2

SUB-NANOMETER-LEVEL SUBSTRATE CLEANING MECHANISM

CLAIM OF PRIORITY

This patent application is a U.S. national-phase application filed under 35 U.S.C. § 371 from International Application Serial No. PCT/US2018/015924, filed on 30 Jan. 2018 and published as WO 2018/144446 on 9 Aug. 2018, which claims priority to U.S. Provisional Application Ser. No. 62/455,425, entitled, "SUBSTRATE CLEANING AND DRYING MECHANISM," filed 6 Feb. 2017; and U.S. Provisional Application Ser. No. 62/518,277, filed 12 Jun. 2017, and entitled, "NANOMETER-LEVEL SUBSTRATE CLEANING MECHANISM," the disclosures of which are each incorporated herein by reference in their entireties.

TECHNICAL FIELD

The disclosed subject matter relates to, for example, cleaning substrates in semiconductor manufacturing fabrication facilities and allied industries. In particular, the disclosed subject matter relates to a method for precision cleaning and drying of flat objects, such as semiconductor-wafers or other substrates.

More specifically, the disclosed subject matter relates to a method of cleaning and drying semiconductor-wafer and other substrates in a single-chamber apparatus equipped with cleaning nozzles for liquid cleaning and with means for flowing an ultra-clean gas (e.g., nitrogen) to assist in evacuating effluents and moisture while rotating the substrate for drying.

BACKGROUND

Cleaning and drying of surfaces of wafers and other substrates is one of the most important steps in the fabrication of semiconductor microelectronic devices. It is well known to a person of ordinary skill in the art that the presence of chemical contaminants and particles of impurities may significantly reduce the yield of fabricated products and noticeably affect the performance and reliability of the produced semiconductor devices (e.g., an integrated circuit) and related or allied devices.

In view of the present trend in the semiconductor and allied industries, which goes far beyond characteristic features of a device having for example, sub-micron sizes, effective techniques for cleaning substrates initially and after various deposition and patterning operations, are becoming increasingly important. Since designed features and design rules for producing the features have become increasingly small, there exists an extreme sensitivity of semiconductor surfaces to the presence of contaminants. For example, total metallic impurities on a substrate (e.g., silicon wafer) should be far less than $10^{10}$ atoms per $cm^2$. The presence of particles larger than 0.1 µm in size should be much less than approximately 0.1 per $cm^2$. In addition, organic contaminants, particulates, and/or other impurities may be present on the substrate. These requirements are unable to be addressed by contemporaneous equipment and techniques.

SUMMARY

Figure 1:
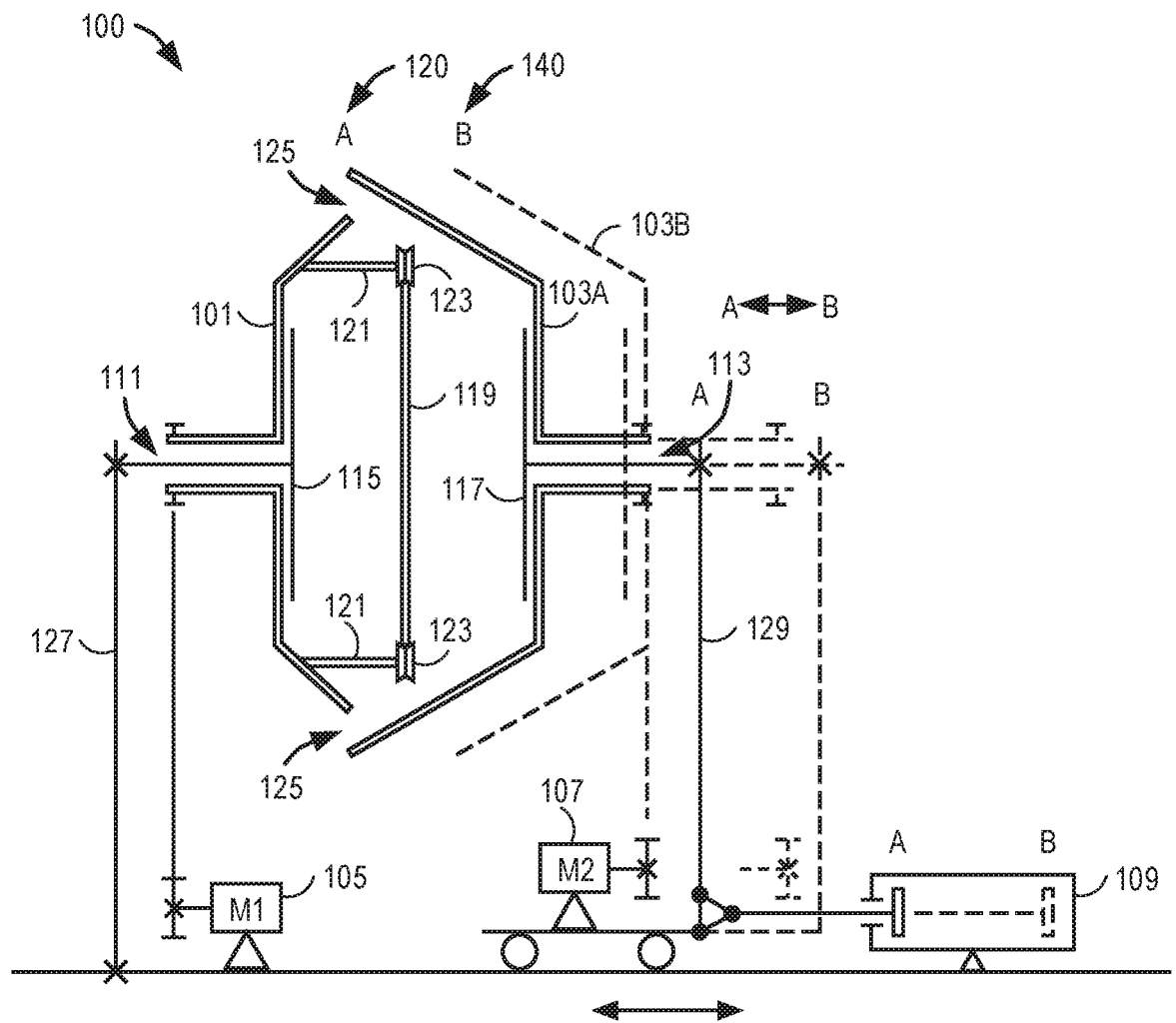
FIG. 1 is a diagram showing a simplified overview of an example of a vertical substrate cleaning and drying chamber mechanism of the disclosed subject matter.

The description that follows includes illustrative apparatuses (devices, structures, systems, and the like) and methods (e.g., processes, sequences, techniques, and technologies) that embody at least aspects of the disclosed subject matter. In the following description, for purposes of explanation, numerous specific details are set forth in order to provide an understanding of various embodiments of the subject matter. After reading and understanding this disclosure, it will be evident to those of ordinary skill in the art however, that various embodiments of the subject matter may be practiced without these specific details. Further, well-known apparatuses and methods have not been shown in detail so as not to obscure the description of various embodiments. Moreover, as understood by a person of ordinary skill in the art, relative terms that may be employed herein (for example, top, bottom, upper, lower, over, under, etc.) are used merely to convey the general concepts disclosed and should not be considered as absolute terms.

Moreover, as the person of ordinary skill in the art will understand upon reading and understanding the disclosure provided herein, the term "or" may be construed in an inclusive or exclusive sense unless otherwise explicitly noted or operationally defined.

During the cleaning operations within a vertical substrate cleaning chamber, one challenge is to remove excess fluids, effluents, and moisture rapidly to enable the drying of the substrate without water or other chemical spots. A vertical substrate cleaning and drying chamber of the disclosed subject matter cleans both faces (sides) of the vertical substrate, as well as the edge(s) of the substrate simultaneously.

DETAILED DESCRIPTION

In general, various components of the disclosed subject matter include, but are not limited to, one or both of a plurality of continuous-liquid spray jets and a plurality of pulsed-liquid spray jets (hydro-jet) chamber. Pulsed-liquid spray jet systems are disclosed in U.S. Published Patent Application No. 200610174919 A1, filed 9 Nov. 2005 and entitled, "Apparatus and Method for Cleaning Flat Objects in a Vertical Orientation with Pulsed Liquid Jet," which is hereby incorporated by reference in its entirety.

The continuous-liquid spray jets and the pulsed-liquid spray jets deliver either a continuous spray or a pulsating spray of process liquids (e.g., one or more combinations of deionized (DI) water or liquid cleaning chemicals on both faces (sides) and edges of the rotating vertical substrate during a cleaning operation). Either one or both of the DI water and the liquid cleaning chemicals may simply be referred to herein as process liquids. In various embodiments, all interior (wetted) surfaces of the chamber may be hydrophobic to assist in evacuating (removing) liquids (e.g., at least a portion of the effluents) from the chamber quickly, thereby reducing or minimizing a drying time of the substrate undergoing cleaning and drying operations.

In various embodiments, the pulsed-liquid spray jets are considered as gasless pulsed-jets since the pulsed-liquid spray jets do not necessarily depend on any type of gas to produce the pulsating spray of process liquids. In one embodiment of a gasless pulsed-jet, a diaphragm pump (e.g., a membrane pump) is utilized to produce gasless pulsed-jets. The diaphragm pump is a positive displacement pump that alternates a reciprocating pumping-action of a liquid from one side of a membrane to the other, thereby creating a continuously varying pressure of the liquid that is presented to a spray-jet nozzle. In a specific exemplary embodiment, a three-diaphragm pump is used to produce a variety of sizes, velocities, and/or numbers of process-liquid droplets from the gasless pulsed-jets. In other embodiments, diaphragm pumps having two, four, or more diaphragms are used to produce gasless pulsed-jets. In still other embodiments, diaphragm pumps having a single diaphragm with only one chamber (e.g., a single-sided diaphragm pump) is used to produce a gasless pulsed-jet.

The skilled artisan will recognize that other pump types, such as a gear-drive pump, alternating-pressure pump, peristaltic pump, axial-piston pump, and others, may be utilized to produce a gasless pulsed-jet as well.

In various embodiments, different forms of pump, for example, the diaphragm pump, may be coupled to a variable-frequency drive. The variable-frequency drive produces different speeds of the piston. For example, a 1 Hz to 10 Hz frequency range can be used to produce atomized droplets from a few tens of microns up to millimeters in size. In a specific exemplary embodiment, droplets may be produced from 30 microns to 150 microns in size with a given nozzle size. In other embodiments, multiple size and types of nozzles can be combined for various applications. Combining multiple sizes and types of nozzles can create yet a greater variation in droplet sizes (e.g., smaller than 30 microns and greater than 150 microns singly or simultaneously).

In various embodiments, one or more of the embodiments for producing a gasless pulsed-jet may be combined with different sizes and shapes of nozzles. Techniques for producing different sizes and shapes of nozzles are known in the art and are also discussed in more detail, below.

Based on the disclosure provided herein, the person of ordinary skill in the art can determine readily a kinetic energy level imparted by each of a variety of droplets produced by the pulsed-liquid spray jets. The determination of kinetic energy is based on, for example, a droplet size, a density of the liquid in the droplet (e.g., a total mass of the droplet), and a velocity of the droplet size. The determination of kinetic energy may then be considered in light of a pressure required to dislodge a given particle size from the substrate. Such pressures are based on forces holding the particle to the substrate (e.g., electrostatic forces, molecular forces, other adhesive forces, etc.), a cross-sectional are of the particle, and an area of the particle in contact with the substrate. Governing equations for determining both kinetic energy and particle dislodge pressures are known in the art.

As described in more detail below, during various ones of the cleaning/drying operations, the substrate is rotating (spinning) vertically within the chamber. Additionally, various embodiments are disclosed herein of, for example, center evacuation and side evacuation rotatable shields. In various embodiments, turbine disks may be attached to one or more of the rotatable shields. In various embodiments, the turbine disks may be independently rotatable. The turbine disks assist in evacuating gases, liquids, and other effluents from the cleaning/drying chamber to assist in more rapidly drying the substrate.

The disclosed subject matter also describes various embodiments of optional drain channels that may be utilized separately or in combination with one another. Various embodiments of gas (e.g., ultra-pure nitrogen) dispense mechanisms inside the cleaning/drying chamber are also disclosed.

As described in more detail below, in various embodiments the vertical substrate cleaning and drying chamber is a closed system having an inner shell and an outer shell. The outer shell opens and closes to load and unload a substrate vertically (e.g., by an end-effector of a robot) for cleaning and drying. The outer shell, when closed, produces a fluid tight seal that prevents any of the process fluids and effluents (e.g., gases and liquids) from leaking outside the outer shell enclosure.

The inner shell includes the vertical substrate holding mechanism, and two rotatable shields that are independently controllable for rotational speed (rotational velocity) and direction. One shield is coupled to a first rotating motor, and may also be coupled to the vertical substrate holding mechanism (and substrate) while the second shield has a separate, independent motor. In specific exemplary embodiments, there are one or more turbine disks attached to the rotatable shields. The turbine disks may be configured with slots placed at various points and angles calculated to provide increased fluid-removal efficiency.

In various embodiments, a gas (e.g., nitrogen, $N_2$), is dispensed via a plurality of different devices. In one example, a mushroom design allows for a low pressure, high flow of gas. In another example, an array of gas outlets in a gas inlet tube produces a knife-edge shower of the gas in the inner chamber. In other embodiments, both devices are combined.

At the start of an exemplary cleaning operation, the substrate is rotated, slowly at first, to facilitate the cleaning of the substrate via multiple streams of liquids that impinge substantially simultaneously on the frontside, backside, and edge(s) of the substrate. During this cleaning operation, multiple liquids can be used depending upon the type of contaminant to be removed from the substrate.

A shield rotary drive mechanism may be coupled with a first of the shields (which may have one of the turbine disks attached to it). As the first shield rotates, the substrate coupled to the shield rotary drive mechanism, also rotates at the same speed. As described above, the second, opposing shield is coupled to a separate, independent motor and also rotates. However, since the second shield has a separate motor, the speed and direction of the second shield is independent of the first shield, and consequently, is also independent of a rotational speed of the substrate. As both shields rotate during the cleaning operation, with one or more liquids impinging onto the substrate, the effluent coming from the vertical rotating substrate is evacuated through the rotatable shields due to a centrifugal-force effect.

The curvature of the shield is designed such that the effluent moves towards an edge (either an inner edge or an outer edge, depending on a particular embodiment) of the shields and is evacuated (removed) from the inner chamber. A rotational speed of the rotatable shields can be increased to increase effluent evacuation. During this cleaning operation, a high purity gas (e.g., ultra-pure nitrogen, carbon dioxide, or other ultra-pure gas) is introduced into the chamber by at least one of the gas-dispersion devices, facilitating dehydration of the moisture-rich environment proximate the rotating vertical substrate.

At the end of the cleaning operation, liquid emanating from the spray jets is stopped. A rotational speed of the rotatable shields, and consequently the speed of the substrate, is accelerated to a higher speed to further facilitate the drying process. In various embodiments, a solvent, such as isopropyl alcohol (IPA) vapor, can also be introduced with the high-purity gas for applications where the substrate may require or be aided by IPA drying. In other embodiments, the solvent may be sprayed separately or may be followed by or in addition to the high-purity gas.

As will be understandable to a person of ordinary skill in the art, the high rotational speed of the shields creates a pressure differential between the substrate and a volume proximate the substrate facilitating evacuation (removal) of both liquids and moisture away from the rotating substrate. The high rotational speed of the substrate, coupled with the gas flow and rotation of the shields, removes all or substantially all effluents and moisture thereby drying the substrate without water or chemical marks. One or more secondary gas flow devices create a gas barrier to prevent or substantially reduce particulate migration into the inner (process) chamber from the outer chamber. During the cleaning and the drying operations, the speed of the rotatable shields can be manipulated to effect a volumetric removal of the effluent and vapor to aid in producing a water/chemical spot free, or substantially spot free, substrate at the end of the cleaning and drying process.

The present invention is applicable to other fields such as cleaning and drying of optical substrates, bio-tech substrates used for gene sequencing and drug discovery, flat panel displays, substrates used in the manufacture of space optics, optical recording substrates, as well as a variety of other substrate types known in various arts. Overall, the principals of the disclosed subject matter will substantially be the same in some respects wherein the substrate will be held vertically and rotated at variable, programmable speeds during cleaning and drying.

With reference now to FIG. 1, a simplified overview of an example of a vertical substrate cleaning and drying chamber mechanism 100 is shown. Overall, the vertical substrate cleaning and drying chamber 100 is shown to include a first rotatable shield 101 and a second rotatable shield in a first position 103A, proximate to the first rotatable shield 101, and in a second position 103B that is moved laterally away from, and therefore distal to, the first rotatable shield 101. As explained in more detail herein, the first rotatable shield 101 and the second rotatable shield capture and redirect cleaning liquids away from a substrate 119. One of the two rotatable shields is configured to move from an operating position 120 (indicated as position "A" on FIG. 1) and a load position 140 (indicated as position "B" in FIG. 1) to allow the substrate 119 to be mounted in and removed from the vertical substrate cleaning and drying chamber 100. An actuator mechanism 109 moves the second rotatable shield 103A, 103B from the operating position 120 to and from the load position 140.

In one embodiment, an angle of peripheral edges (where the edge is a portion of the shields that extend away from a base portion of the shield, the base portion being substantially vertical and parallel to the substrate 119) of the first rotatable shield 101 and the second rotatable shield 103 (relative to normal of a vertical location of the substrate 119) may be designed to have one or more angles. For example, the peripheral edges may have an angle be from about 3° to about 15°. In other embodiments, the angle may be from about 1° to about 3°. In other embodiments, the angle may from about 15° to about 45° or more. In embodiments, the angle may not be a continuous straight angle but may be comprised of various straight portions, with each of the straight portions having different angles (e.g., increasing in angle as edges of the rotatable shields approach the openings 125). In still other embodiments, the peripheral edges of the rotatable shields may be curved (e.g., see FIG. 4), where the curvature has either a constant radius or variable radii. Additionally, the skilled artisan will recognize that a steeper angle (e.g., 15° rather than 5°) or greater radius of curvature may provide for more efficient liquid/effluent removal from the chamber.

As described below with reference to FIG. 11, the peripheral edges may have negative angles (a reverse slope with reference to the peripheral edges of FIG. 1). However, the greater angle or greater radius of curvature will also increase a physical overall height of the chamber. Therefore, the skilled artisan will recognize how to achieve a balance between steepness or angle/greater radius of curvature versus a reasonable size of the chamber based on reading and understanding the disclosure provided herein. Each of the embodiments may be accomplished by machining, stamping, deep drawing, or otherwise forming the shields by techniques known in the art.

In various embodiments, a larger of the shields (the second rotatable shield 103 in the example of FIG. 1) extends over the smaller shield. Although not shown, at least one or both of the rotatable shields may be formed to have a labyrinth lip (not shown but understandable to a skilled artisan) at an outermost peripheral edge (e.g., near the openings 125) to form a mechanical seal to remove most or all fluid droplets, thereby preventing or substantially eliminating any fluid from dripping back into an interior portion of the chamber containing the substrate (see, e.g., FIG. 15). Consequently, a profile of the outermost peripheral edge may be formed such that the fluid droplets cannot collect above the substrate, thereby preventing fluid from dripping.

The actuator mechanism 109 may be pneumatically activated, hydraulically activated, magnetically activated, electrically activated, or by other means or by a combination of means as understood by the skilled artisan. The actuator mechanism may also include various types of position sensors (e.g., electrical, optical, etc.) to indicate whether the second rotatable shield 103A, 103B is in the operating position 120 or the load position 140. In various embodiments, the position sensors (not shown) may be located in other locations outside of or in addition to being placed within the actuator mechanism 109.

As noted in FIG. 1, the substrate 119 is held in a substantially vertical position during both cleaning and drying operations. In some embodiments, the vertical position is maintained within a range of approximately ±0.1 degree to approximately ±1 degree from vertical. In some embodiments, the vertical position is maintained within approximately ±2 degrees from vertical. In other embodiments, the vertical position is maintained within approximately ±5 degrees from vertical. In still other embodiments, the vertical position is maintained within approximately ±10 degrees from vertical. The substantially vertical positioning of the substrate 119 allows for simultaneous frontside and backside cleaning (as well as edge cleaning) and an increased and more thorough drying of the substrate 119 from both sides (and an edge or edges depending upon a shape of the substrate (e.g., circular versus square)) simultaneously since liquids are less likely to remain on a surface of the substrate 119 while it is in a vertical orientation. The substrate 119 may be a patterned or unpatterned circular semiconductor wafer that is, for example, 100 mm to 450 mm in diameter, a square quartz-photomask that is, for example, 125 mm or 150 mm per side, or any of a variety of other substrates known and used in the semiconductor and allied industries such as flat-panel display substrates and magnetic and optical disk substrates.

Although FIG. 1 indicates that the second rotatable shield 103A, 103B (generally also referred to collectively as the second rotatable shield 103 herein) is the shield that moves for substrate exchange, a person of ordinary skill in the art would understand, upon reading and understanding the disclosure provided herein, that, in other embodiments, the first rotatable shield 101 moves toward and away from the second shield 103. In still other embodiments, both the first shield 101 and the second shield 103 can be configured to move laterally toward and away from each other. Therefore, for brevity of notation throughout the disclosure contained herein, the second shield 103 will be indicated as the movable shield.

Further, although the first rotatable shield 101 is shown in FIG. 1 to be smaller than the second rotatable shield 103, and therefore being capable of being circumscribed by the second rotatable shield in the first position 103A, the skilled artisan will recognize that the second rotatable shield 103 can be configured to be smaller than, and therefore be circumscribed by the first rotatable shield 101, when the two shields are proximate one another (in the operating position 120).

With continued reference to FIG. 1, a first-side spray-jet array 115 and a second-side spray-jet array 117 are shown, coupled to a first-side liquid supply line 127 and a second-side liquid supply line 129, respectively. The spray jets are configured, during a cleaning operation of the substrate cleaning and drying chamber 100, to spray one or more liquids onto each face as well as the edges of the substrate 119. The spray jets are arranged to cover at least the entire diameter of the substrate on each face of the substrate thereby providing liquid to each entire face once the substrate has been rotated. The liquids may include, for example, deionized (DI) water or one or more various types of chemical cleaning liquids.

As described in more detail below, each of the first-side spray-jet array 115 and the second-side spray-jet array 117, include a plurality of spray jets. In various embodiments, the spray jets may also be configured to lie pulsed, as discussed above, thereby adding mechanical agitation to the sprayed liquid, potentially increasing the cleaning efficiency in certain operations.

FIG. 1 also shows a first-side gas inlet 111 and a second-side gas inlet 113 arranged to allow a clean gas, such as filtered clean, dry air (CDA), nitrogen, argon, or a number of other filtered or high purity/ultra-clean gases to be introduced into the vertical substrate cleaning and drying chamber 100 during a drying operation of the substrate 119. Various embodiments of the drying operation are described in more detail below.

When the vertical substrate cleaning and drying chamber 100 is in the load position 140 (position "B"), an end effector (not shown) from a robot can pick the substrate 119 from a substrate carrier (e.g., a front-opening unified pod (FOUP) for carrying and transporting 300 mm semiconductor wafers) to be placed and held by a number of finger-end caps 123, each attached to a number of finger arms 121. The finger arms 121 are in turn mechanically coupled to the first rotatable shield 101. Depending on various physical parameters and geometries of the substrate 119, there can be three or more finger arm 121 and finger-end cap 123 combinations. For example, in the case where the substrate 119 is a circular substrate, there may be three finger arm 121 and finger-end cap 123 combinations. In the case where the substrate 119 is square, rectangular, or otherwise polygonal, there may be four or more finger area 121 and finger-end cap 123 combinations. The skilled artisan will recognize how to modify the number of finger arm 121 and finger-end cap 123 combinations for a given substrate 119 size and shape.

The finger arm 121 may be fabricated from a number of materials, depending on a particular application of the vertical substrate cleaning and drying chamber 100. For example, the finger arm 121 may comprise various metals such as aluminum (Al) or stainless steel (e.g., 316L) or other metal alloys, ceramics such as aluminum oxide $Al_2O_3$) or carbide, or various types of plastics. Additionally, depending on a choice of the finger arm material, the substrate being cleaned, and the industry in which the chamber is being utilized, the material comprising the finger arm 121 may be coated with various types of material including, for example, perfluoroalkoxy (PFA), fluorinated ethylene propylene copolymer (FEP), a copolymer of ethylene and tetrafluoroethylene (ETFE), polytetrafluoroethylene (PTFE), and other single or multi-layer coatings known in the relevant art.

The finger-end caps 123 may be fabricated from a number of materials that have some flexibility such as various plastics (e.g., an acetal homopolymer or acetyl resin, such as Deirin®, various other types of polyoxymethylene-(POM) based plastics, or other thermoplastic materials and various synthetic polymers). The skilled artisan will recognize a number of other materials (e.g., aluminum or other coated metals, metal alloys, and ceramics) may be suitable at least partially depending on a material from which the substrate is formed.

At least one of the finger arm 121 and finger-end cap 123 combinations is movable to allow the substrate 119 to be readily mounted in the vertical substrate cleaning and drying chamber 100. For example, the finger arm 121 and finger-end cap 123 combination may be angled away from a substrate holding position to allow the end effector from the robot to readily position (e.g., insert for clamping) or remove the substrate 119. One embodiment of a movable finger arm 121 and finger-end cap 123 combination is described in detail below with reference to FIG. 8 et seq. A positioning indicator (not shown but known in the art such as a laser-based, mechanical-based, optical-based, magnetic-proximity based, or other substrate proper-loading indicator) ensures proper alignment of the substrate 119.

In the case of a circular substrate, the substrate is held by three slender finger arms (only two of which are shown in FIG. 1). In this example, the finger arms are spaced about 120 degrees apart. One of the finger arms, in the 12:00 o'clock position, has an actuator linked to it (described in more detail, below) while the other two arms are rigid with no actuation. The finger caps 123, one on each finger arm 121, may be shaped like rollers (even though, in embodiments, the finger caps 123 are non-rotatably mounted to a respective finger arm 121) with, for example, a V-groove or a U-groove into which the substrate is placed during cleaning and drying operations. A profile of the groove is designed such that it ensures that the substrate can self-align when placed in the grooves by an end-effector of a robot (described in more detail, below).

In various embodiments, the profile of the groove is shaped and sized such that only edges of the substrate are in contact with portions of the groove such that faces of the substrate are not in contact with the groove or any portion of the finger caps 123. Further, the groove is sized and shaped such that no portion of the faces of the substrate are covered by the groove or any portion of the finger caps 123.

As described in more detail with reference to FIG. 8, below, when the robot brings the substrate into the opened chamber, the actuator-linked finger arm (e.g., programmed to stop at the 12:00 o'clock position or other substrate exchange position so as to not interfere with a path of an end effector of the robot) is actuated via an air cylinder (not shown in FIG. 1) and cam mechanism. As the air cylinder pushes against a metal plate, the cam operates the arm to open upwards, allowing for the robot to bring the substrate into the chamber and situate the substrate into a groove on at least one (or two in the case of a circular substrate) finger arm 121 and finger-end cap 123 combination. Once the substrate is positioned within the groove, or grooves, of the one or more finger-end caps, the air cylinder retracts thereby operating the cam mechanism again, closing the actuator-linked finger arm and clamping the substrate. During this time, a substrate-present sensor (discussed with reference to FIG. 5, below) ensures that the substrate is sitting properly in the grooves. As noted above, if the substrate is not properly positioned (e.g., the substrate is tilted), the system goes into an error mode until the substrate is removed and repositioned properly by the robot via a recovery and reposition mode, programmed into the system as understandable by a skilled artisan.

With continued reference to FIG. 1, a first motor 105 and a second motor 107 are arranged to rotate the first rotatable shield 101 and the second rotatable shield 103, respectively. The first motor 105 and the second motor 107 may be rotary actuators of various types (e.g., electrical, pneumatic, hydraulic, etc.) or other rotational actuator-mechanism known in the art.

During a substrate cleaning operation, since the substrate 119 is, in this embodiment, mechanically coupled to the first rotatable shield 101, the substrate 119 may be rotated relative to both the first-side spray-jet array 115 and the second-side spray-jet array 117 by the first motor 105. Independently, the second rotatable shield 103, at the operating position 120, may be rotated by the second motor 107. In various embodiments, the first motor 105 and the second motor 107 may rotate the respective shields in the same direction or in opposite directions, or both directions in different timeframes. The first motor 105 and the second motor 107 may also rotate the respective shields at either the same rotational speed or different rotational, programmable speeds, or both, in different timeframes.

During a substrate drying operation, the second rotatable shield 103 remains at the operating position 120. The first motor 105 and the second motor 107 may rotate the respective shields in the same direction or in opposite directions, or both directions in different timeframes. The first motor 105 and the second motor 107 may also rotate the respective shields at either the same rotational speed or different rotational speeds, or both, in different timeframes. As described in more detail below, the rotational speeds can also be varied depending upon a particular operation (e.g., cleaning or drying) or varied during the particular operation.

During the drying operation, centrifugal forces on the substrate 119 caused by the rotational motion, in combination with gases introduced into the vertical substrate cleaning and drying chamber 100 through the first-side gas inlet 111 and the second-side gas inlet 113, along with gravitational forces due to the vertical positioning of the substrate 119, help dry the substrate 119 much more rapidly than is currently known by various substrate drying mechanisms of the prior art. Liquids introduced into the vertical substrate cleaning and drying chamber 100 during the preceding cleaning cycle are evacuated from the chamber through the openings 125 formed between the first rotatable shield 101 and the second rotatable shield 103 in the operating position 120.

Figure 2:
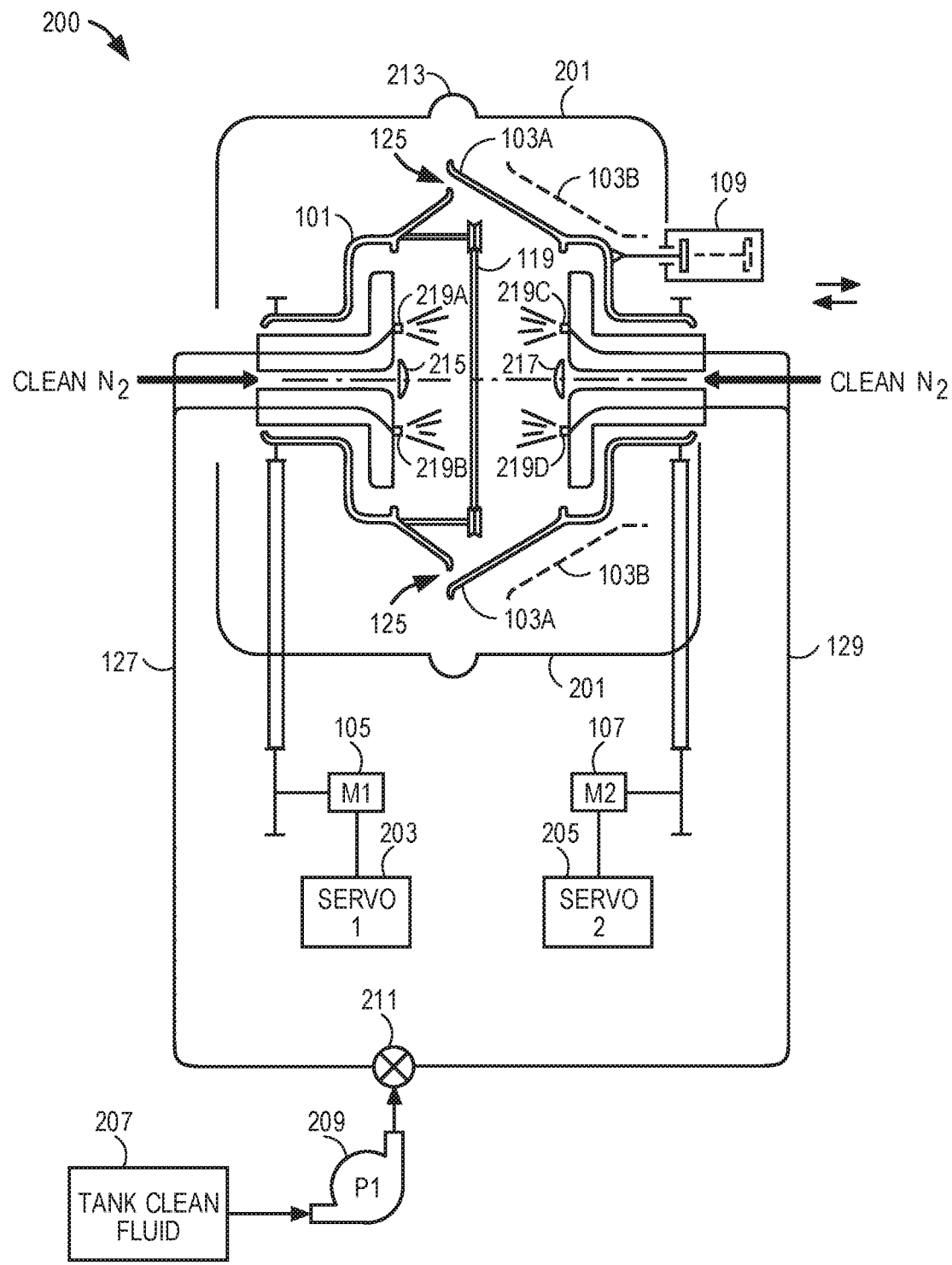
FIG. 2 is a diagram showing an outer chamber plus additional details of the vertical substrate cleaning and drying chamber mechanism of FIG. 1.

Referring now to FIG. 2, a diagram showing an outer chamber 200 plus additional details of the vertical substrate cleaning and drying chamber mechanism 100 of FIG. 1 is shown. FIG. 2 is shown to include an outer chamber 201, a first servomechanism 203 electrically, optically, or mechanically coupled to the first motor 105 and a second servomechanism 205 electrically, optically, or mechanically coupled to the second motor 107, one or more fluid tanks or reservoirs 207 for containing cleaning fluids (only one is shown), including, for example, DI water or other aqueous-based or solvent-based cleaning solutions or chemicals, used to clean the substrate 119, one or more fluid pumps 209 (only one of which is shown), and a pump control mechanism 211.

The outer chamber 201 can be made of a variety of materials and can be coated, inside or outside, with one or more materials as needed or required for various industries. The materials and coatings are described above with reference to FIG. 1.

The first servomechanism 203 and the second servomechanism 205 may be any number of mechanisms known in the control engineering field. Generally, a servomechanism employs error-sensing devices or feedback schemes to verify the action of another device, such as a rotational device. With reference to FIG. 2, the first servomechanism 203 and the second servomechanism 205 control the first motor 105 and the second motor 107, respectively. The servomechanisms therefore help to control speed, acceleration, and direction of the motors.

The fluid pump 209 can be any of a variety of pumping-mechanisms designed to move and transmit various types of liquids or slurries (liquids containing abrasive or other suspended particulates, e.g., colloidal suspensions of particles) from the reservoir 207 to the first-side spray-jet array 115 and the second-side spray-jet array 117 (see FIG. 1). The pumping mechanisms can include radial-flow pumps, axial-flow pumps, peristaltic pumps, or a variety of other types of pumps known in the art.

As shown, the first-side spray-jet array 115 includes a first plurality of spray jets 219A, 219B and the second-side spray-jet array 117 includes a second plurality of spray jets 219C, 219D. The plurality of spray jets is designed to fully cover, perhaps with some overlap between adjacent jets, both faces of the substrate 119 as well as at least a portion of edge(s) of the substrate 119. Although only a total of four spray jets 219A, 219B, 219C, 219D are shown, the skilled artisan will recognize, upon reading and understanding the disclosure provided herein, that fewer or more spray jets may be used for a given application and geometry of the substrate 119.

In addition, a special single or multiple spray edge-jets (not shown directly but readily understandable to a person of ordinary skill in the art) can be directed separately at edge(s) of the substrate. The special single or multiple spray edge-jets may be similar to the plurality of spray jets 219A to 219D and may be used to perform special cleaning functions or enhanced edge-cleaning. The edge-jets can also be fed with the same or differing cleaning fluids and DI water than the fluids fed to the jets directed at the surfaces (faces) of the substrate.

In addition, or as a separate operation, while the frontside and backside of the substrate are cleaned with jets of a chosen cleaning fluid or DI water (for example), a special single or multiple spray edge-jets can be directed separately at edge(s) of the substrate to perform special cleaning functions or enhanced edge cleaning. The edge-jets can also be fed with the same or differing cleaning fluids than the fluids fed to the jets directed at the surfaces (faces) of the substrate as described in more detail below.

FIG. 2 is also shown to include a first-side gas dispersion mechanism 215 and a second-side gas dispersion mechanism 217. The dispersion mechanisms are used to disperse and redirect any incoming gas through the first-side gas inlet 111 and the second-side gas inlet 113 (see FIG. 1) during, for example, a drying operation.

In one embodiment, the gas dispersion mechanisms 215, 217 may be configured in a spaced-apart relationship (e.g., by perhaps about 1 mm to about 5 mm or various other distances subsumed within this range) from the respective spray-jet arrays to deflect and disperse incoming gases from impinging on opposing faces of the substrate 119. In other embodiments, the gas dispersion mechanisms may be configured with an array of apertures or orifices around the periphery of the dispersion mechanism to direct the incoming gases in a plane substantially parallel to faces of the substrate 119. In other embodiments, the gas dispersion mechanisms may be configured to incorporate both a spaced-apart relationship from the respective spray-jet arrays and also incorporate an array of apertures or orifices. The skilled artisan, upon reading and understanding the disclosure provided herein, can envision other forms that the dispersion mechanisms may take, which are intended to be within the scope of the present disclosure. Overall, the dispersion mechanisms, described in more detail below, assist in evacuation of liquids from the vertical substrate cleaning and (frying chamber 100 to the outer chamber 201.

The outer chamber 201 may include an optional drain channel 213 to collect liquid evacuated from the vertical substrate cleaning and (frying chamber 100. The drain channel 213 and its function are described in more detail below.

Figure 3:
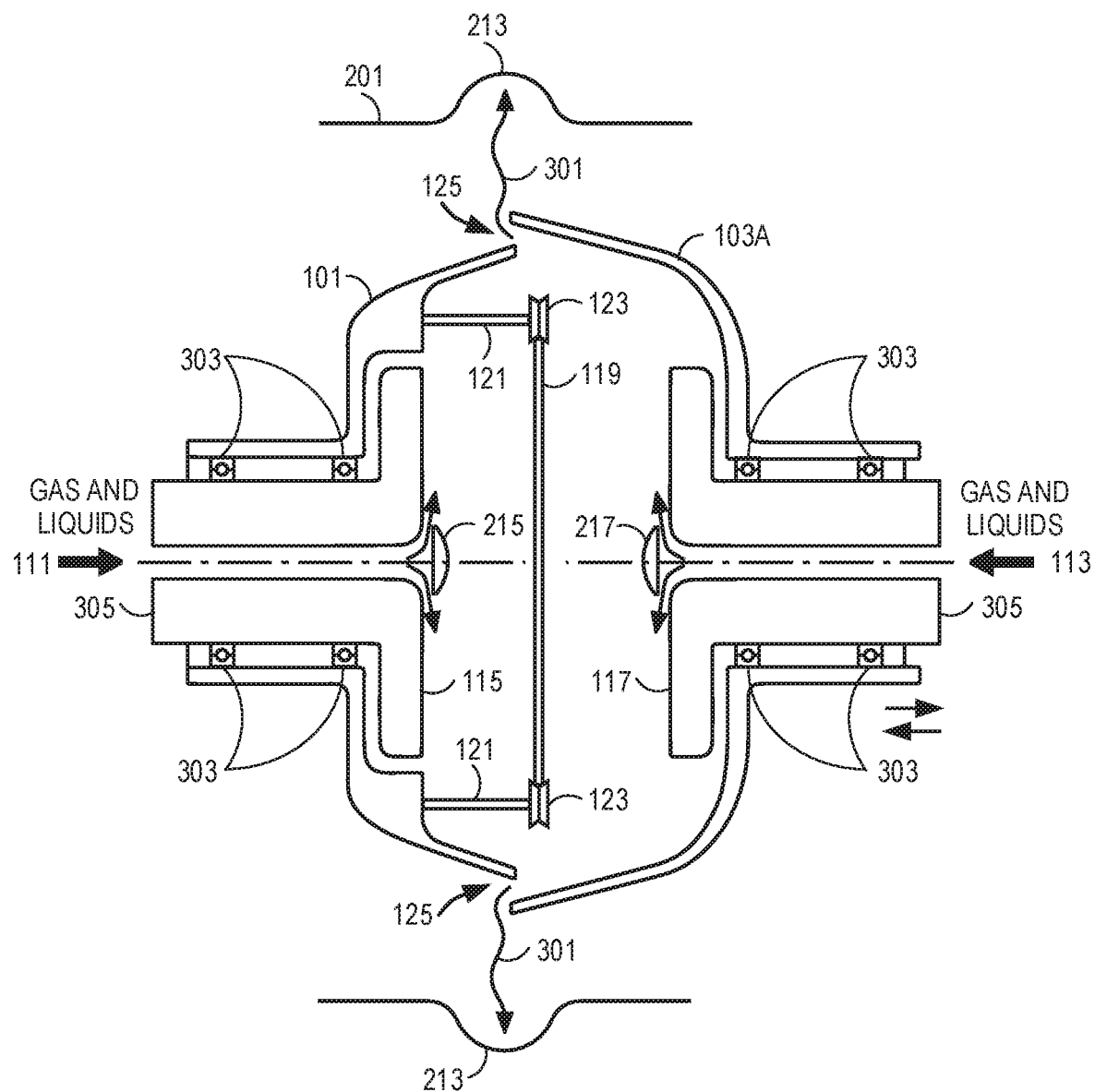
FIG. 3 is a diagram showing additional details of the mechanisms of FIGS. 1 and 2 during a substrate drying operation.

FIG. 3 shows additional details of the mechanisms of FIGS. 1 and 2 during a substrate drying operation. As shown in FIG. 3, during a drying operation, gas (e.g., nitrogen, $N_2$) is introduced through the first-side gas inlet 111 and the second-side gas inlet 113 of the first-side spray-jet array 115 and the second-side spray-jet array 117, respectively. As shown, the first-side spray-jet array 115 and the second-side spray-jet array 117 may be considered as static manifolds, as the spray-jet arrays serve to transport both liquids to the plurality of spray jets through the liquid supply lines (see FIG. 2) and gases through the gas inlets 111, 113. In various embodiment, the spray-jet arrays are located within a fluid manifold 305 and may be positioned concentrically or nearly concentrically within the first rotatable shield 101 and the second rotatable shield 103. In various embodiments, the fluid manifolds are static (non-rotatable) and are positioned within the rotatable shields 101, 103 by a plurality of bearings 303 or other mechanical or electrical devices that are known in the art.

As shown in FIG. 3, there are two fluid manifolds 305, one on either side of the substrate 119 with spray-jet arrays (not shown in FIG. 3) arranged in such a way that they dispense a fan spray of DI water or other chemical-cleaning fluids aimed at the substrate 119 and covering the diameter (or other characteristic dimension) of the substrate 119. The spray-jet arrays 115, 117 may also be arranged such that adjacent ones of the jets overlap each other to clean an entire front or back surface of the substrate as well as an edge (or edges in the case of a non-circular substrate). By overlapping the jets, a higher removal of particulates, films, residues, and so can be achieved without the use of concentrated chemicals. Moreover, the rotation of the substrate 119 during a cleaning operation ensures full substrate (faces and edge (s)) coverage during cleaning.

The fluid manifold 305 may be formed or otherwise manufactured from, for example, polyvinylidene fluoride, or polyvinylidene difluoride, (commonly referred to as PVDF) or other non-reactive thermoplastic fluoropolymers, or various metals (e.g., aluminum), metal alloys (e.g., stainless steel), or other materials known in the art. As an example, PVDF material is generally inert to all solvents, bases, and acids.

During the drying operation, the first rotatable shield 101, and consequently the finger arm 121 and finger-end cap 123 combinations, and the substrate 119 mechanically coupled to the arm/cap combinations, are either rotating at a predetermined velocity, or are accelerating to a predetermined velocity (or a series or predetermined velocities). The rotational motion expels liquid, used during a preceding cleaning operation, from the substrate 119 into the vertical substrate cleaning and drying chamber 100 (see FIG. 1). The introduced gas (e.g., $N_2$) is redirected (to avoid direct impingement onto the substrate 119) by the gas dispersion mechanisms 215, 217 and serves to direct liquids or liquid vapors within the vertical substrate cleaning and drying chamber 100. The liquids or liquid vapors are then directed by the introduced gas through the openings 125 between the rotatable shields 101, 103A of the chamber. After being evacuated from the chamber, the expelled liquids or liquid vapors 301 are then directed to the drain channel 213 in the outer chamber 200 (see FIG. 2). As explained in more detail below, the drain channel 213 is coupled in fluid communication with a facility drain in the environment (e.g., a semiconductor fabrication facility). Further, the drain channel 213 assists in preparing the outer chamber to be dry, or substantially dry, before substrate drying operations are started.

Figure 4:
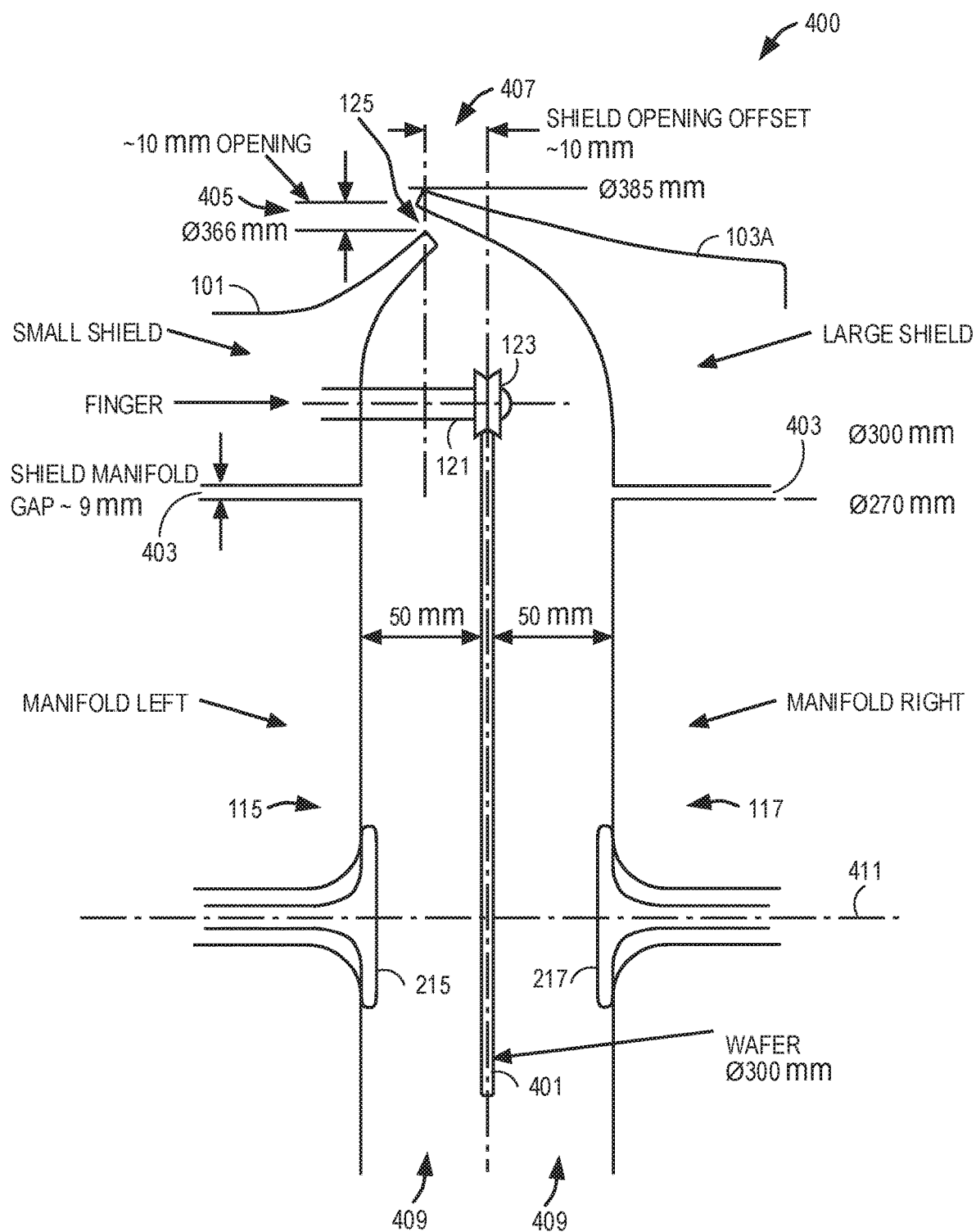
FIG. 4 shows examples of various physical dimensions of a portion of the vertical substrate cleaning and drying chamber mechanism of FIG. 1, when used with a 300 mm wafer.

Referring now to FIG. 4, examples of various physical dimensions of a portion 400 of the vertical substrate cleaning and drying chamber mechanism 100 of FIG. 1, when used with a 300 mm wafer are shown. The dimensions are provided merely as an aid in understanding the disclosed subject matter subject matter. As such, the provided dimensions should not be construed to limit the present disclosure in any way.

The portion of the chamber of FIG. 4 may be considered a center-exhaust chamber as described herein. The exemplary physical dimensions and layout were also used for various computational fluid dynamic (CFD) analyses described below with regard to FIGS. 18 and 19. In the example of FIG. 4, a 300 mm wafer 401 is shown mounted and mechanically coupled to the first rotatable shield 101. In this example, the 300 mm wafer 401 is mounted by a distance 409 of 50 mm from each of the first rotatable shield 101 and the second rotatable shield 103A. An axial centerline 411 (axis of rotation) shown to indicate an approximately axial center of the wafer 401. The skilled artisan will recognize that the distance 409 may be adjusted readily based on factors such as a physical size of the substrate undergoing a cleaning and drying operation. For example, a small substrate, such as a 100 mm semiconductor wafer, may be placed closer to the rotatable shields than may be required for a 300 mm wafer. Conversely, a substrate with a higher value of surface roughness, patterned or machined features, or other asperities, may require a distance 409 larger than 50 mm to remove effectively the liquids used to clean the substrate having a rougher or patterned surface.

The first-side spray-jet array 115 and the second-side spray-jet array are each spaced apart from the respective shields (the first rotatable shield 101 and the second rotatable shield 103) by a shield manifold gap 403 of 9 mm. The shield manifold gap 403 may be readily adjusted based on a number of factors such as anticipated vibrational considerations (e.g., when spinning a non-symmetrical substrate) and overall machining tolerances.

FIG. 4 also shows a shield opening 405 (a vertical distance between the two rotatable shields) of 10 mm. This gap may be adjusted readily for a given application depending on factors such as a volume of liquid used during cleaning operations and a rate at which liquids, liquid vapors, and gases are evacuated from the vertical substrate cleaning and drying chamber.

As noted above, person of ordinary skill in the art will recognize that the physical dimensions provided within FIG. 4 are exemplary only. (As the term is used herein, "exemplary" refers to one example or a set of examples only, and should not necessarily be construed as the preferred or best way to implement portions of the disclosed subject matter described herein.) Consequently, the physical dimensions should be viewed as aiding the skilled artisan in explaining the disclosed subject matter and therefore should not be seeing as limiting the scope of the disclosed subject matter.

Figure 5:
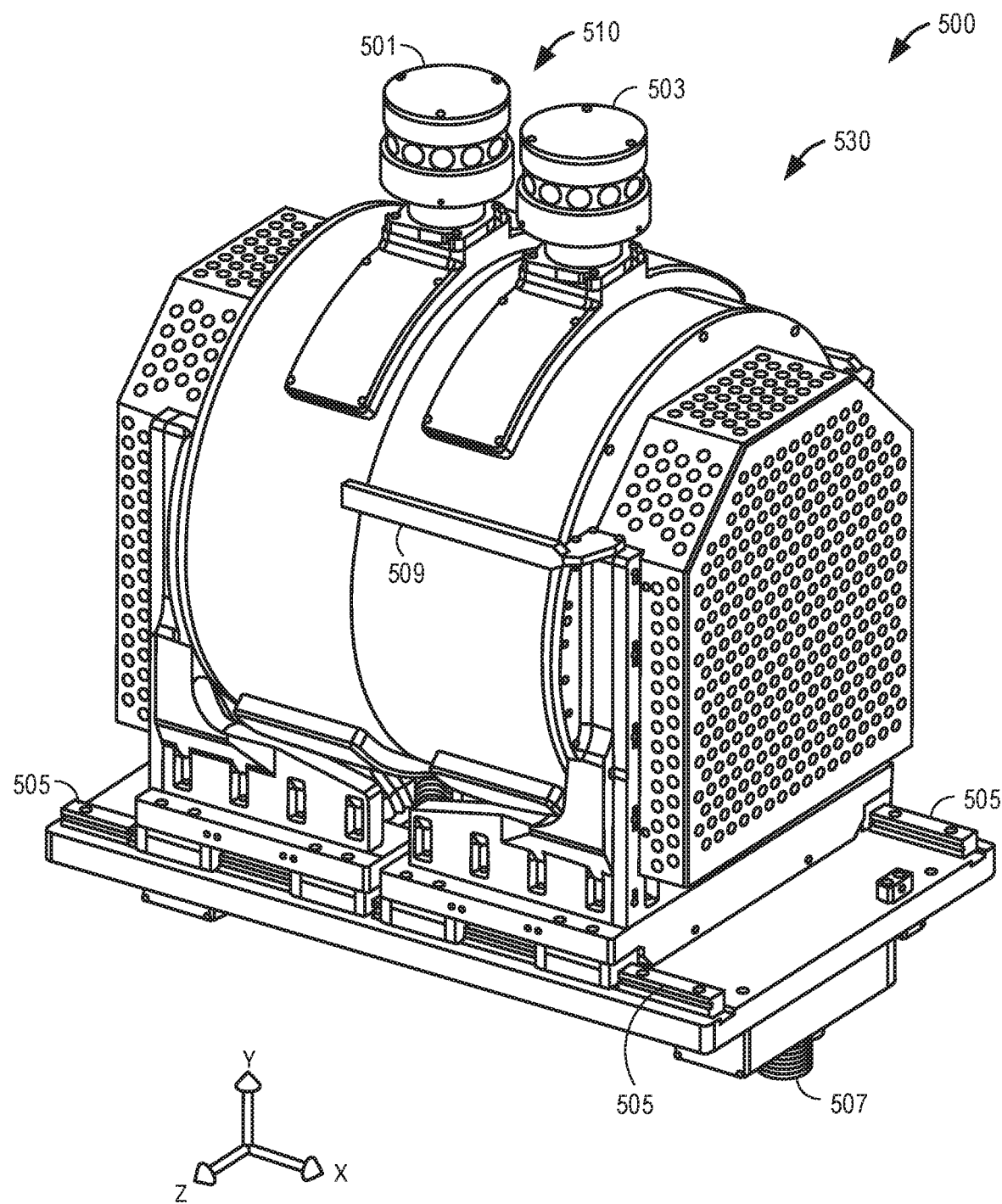
FIG. 5 shows a three-dimensional example of an exterior view of the vertical substrate cleaning and drying chamber mechanism described by FIG. 1.

With reference now to FIG. 5, an example of a three-dimensional chamber 500 of an exterior view of the vertical substrate cleaning and drying chamber mechanism described by FIG. 1 is shown. The three-dimensional chamber 500 is shown to include a first filter unit 501 mechanically coupled to a first portion 510 of the three-dimensional chamber 500 and a second filter unit 503 coupled to the second portion 530 of the three-dimensional chamber 500.

Each of the filter units may contain, for example, a High-Efficiency Particulate Air (HEPA) filter, an Ultra-Low Particulate Air (ULPA) filter, or some other type of air/gas filter known in the art. A choice of the type of filter may be determined by a level of air/gas purity required for a given operation, substrate type, industry, or application. For example, a semiconductor device fabricator making high-density memory devices with small feature sizes (e.g., 65 nm or smaller) may require an ULPA filter whereas a solar-cell manufacturer working with polysilicon wafers with much larger feature sizes (e.g., 2 μm or larger) may only require a filter with a Minimum-Efficiency Reporting Value (MERV) rating of 16 or greater. Such filter designations are well-known in the relevant art.

Regardless of the efficiency rating of a given filter, the first filter unit 501 and the second filter unit 503 provide clean, filtered air to an interior of the chamber 500. For example, the filter units 501, 503 can provide a filtered-air make-up supply to the chamber. One function of the make-up air is to allow a steady flow of clean dry air into the chamber 500 as the chamber evacuates itself during the cleaning and drying operations described herein. The chamber air and other gas (e.g., nitrogen) removal is supplemented by a house exhaust system within a given fabrication facility tied into a drain exhaust housing below the process chamber through fluid exhaust ports 507, discussed below. The exhaust may be further supplemented by an exhaust fan (not shown) installed in the pump cabinet to prevent a drop in exhaust during the process cycle. Uses of the filtered air are described in more detail, below. Moreover, the first filter unit 501 and the second filter unit 503 can provide a filtered-air supply that can be used on various chamber controls including pneumatics on, for example, various electrical and control systems of the chamber 500.

As noted above with reference to FIG. 1, at least one of the rotatable shields 101, 103, is configured to be moved to place a substrate 119 between the shields. The shields (not shown in FIG. 5) are located within the chamber 500. Consequently, either the first portion 510 or the second portion 530, or both, are configured to be moved along, for example, linear tracks 505 such that an end effector from a robot (described above) can place a substrate, to be cleaned and dried, within the chamber 500. The substrate 119 is subsequently mounted within the rotatable shields (that are stationary unless undergoing a cleaning or drying operation) and onto the three or more finger arm 121 and finger-end cap 123 combinations, as described above. A substrate-present sensor 509 aids in ensuring that the substrate (not shown) is present and is properly mounted and gripped by the finger arm 121 and finger-end cap 123 combinations. The substrate-present sensor 509 may be any of a variety of sensors known in the art such as, for example, a laser-based or other optically-based sensor.

For example, in various embodiments, the substrate-present sensor 509 may be an emitter-receiver type of sensor that emits a light beam once the substrate 119 is placed on the finger arm 121 and finger-end cap 123 combinations inside the chamber. A receiver (not shown) installed on an opposing side of the chamber to the substrate-present sensor 509 (e.g., at a backside of the chamber 500) receives the beam emitted by the sensor and provides input to a control processor (not shown but understandable to a skilled artisan) that the substrate is vertically placed and properly oriented in the substrate holding mechanism. If the wafer is not properly placed, the system provides an error message and prevents the machine from running until the substrate is removed and properly reinserted.

Each of the drain channels 213 (see FIGS. 2 and 3) may be in fluid communication with a fluid exhaust port 507. The liquid exhaust is, in turn, coupled to a drain within the facility in which the chamber 500 is installed.

Figure 6:
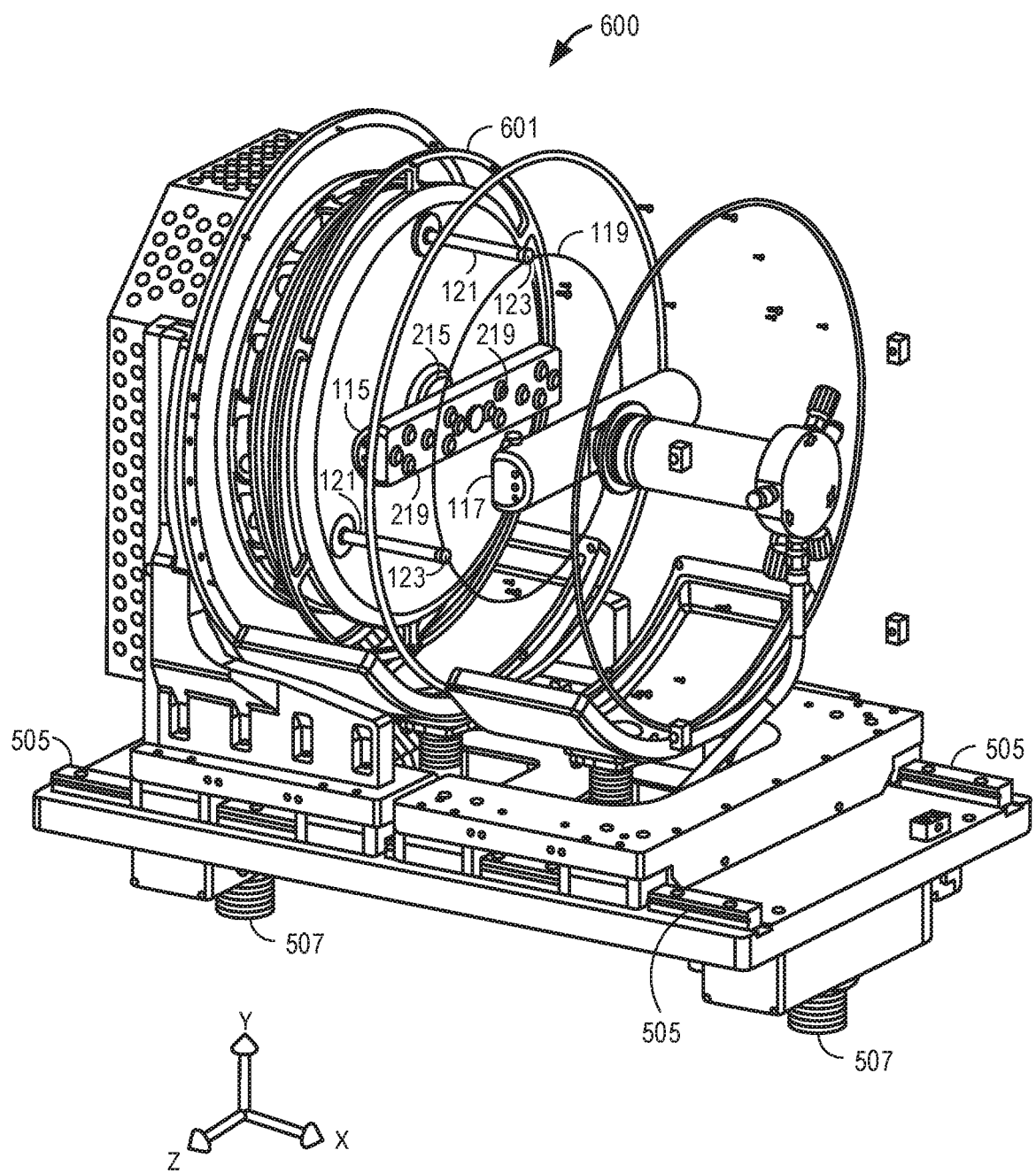
FIG. 6 shows a three-dimensional example of an interior portion of the chamber mechanism of FIG. 5.

FIG. 6 shows a three-dimensional example of an interior portion 600 of the chamber mechanism 500 of FIG. 5. The outer chamber and the rotatable shields have been removed in FIG. 6. As described above with reference to FIGS. 1 through 3, various components of the vertical substrate cleaning and drying chamber 100 (see FIG. 1) are shown in a specific exemplary embodiment. For example, the substrate 119 is shown mounted to three (only two are visible in FIG. 6) of the finger arm 121 and finger-end cap 123 combinations and situated apart from and between the first-side spray-jet array 115 and the second-side spray-jet array 117. Further, various ones of the spray jets 219 are visible on the first-side spray-jet array 115.

Evacuation of liquids or liquid vapors may be assisted by various types of turbine blade mechanisms 601 configured to withdraw liquids and vapors from the chamber.

Figure 7:
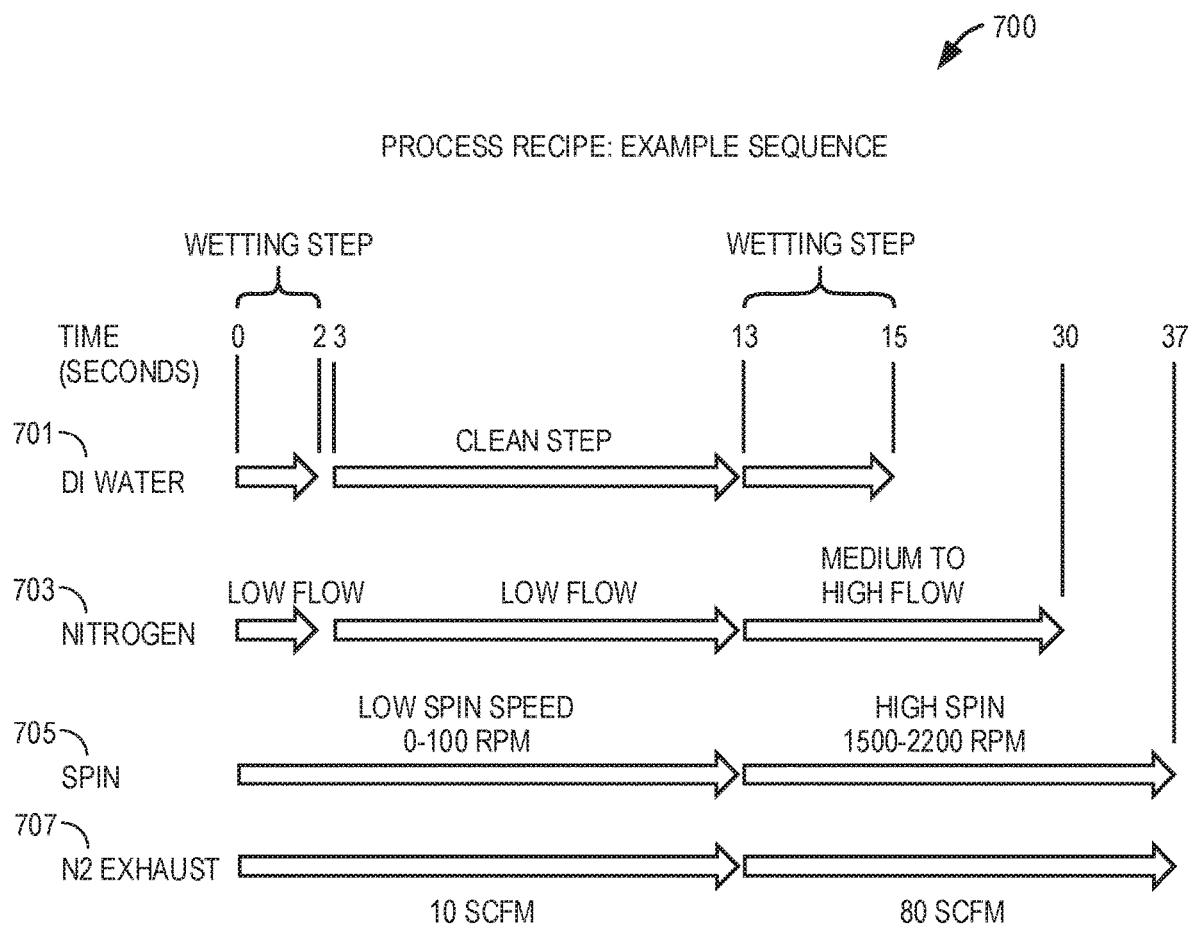
FIG. 7 shows an example of a process recipe for the vertical substrate cleaning and drying mechanism of FIGS. 1 through 6.

FIG. 7 shows an example of a process recipe 700 for the vertical substrate cleaning and drying mechanism of FIGS. 1 through 6. A substrate is placed within the clamping mechanism by an end effector on a robot (not shown). Once the substrate is loaded into the process chamber, the chamber receives a command from a controller or microprocessor (not shown but understandable to the skilled artisan) to start the process.

As noted above and with concurrent reference to FIGS. 1 and 2, the first motor 105 provides a rotating (spinning) motion at a pre-defined, programmable speed, at operation 705 (described below), that is coupled with the first rotatable shield 101. The rotating motion is subsequently coupled to the substrate 119. Therefore, as the first rotatable shield 101 rotates, the substrate 119 that is coupled to the rotatable shield also rotates at the same speed. The second rotatable shield 103 (now in the first position for the cleaning and drying operation) is coupled to its own motor (i.e., the second motor 107) and also rotates. However, as described above, the speed of the second rotatable shield rotates at a preselected speed and is independent of the first rotatable shield 101, and consequently, the second shield is also independent of the speed of the rotational speed of the substrate 119.

At operation 701, deionized (DI) water or other liquid-based cleaning chemicals (hereinafter referred to also as liquids to include both DI water and liquid-based cleaning chemicals) are introduced substantially simultaneously after the substrate starts rotating, or shortly before or thereafter, to both faces and edges of the substrate 119 through the first-side liquid supply line 127 and the second-side liquid supply line 129 while at least the first rotatable shield 101 is ramped up at operation 705 from 0 to about 100 rpm during a low speed spin. The DI water initially starts spraying for a pre-wet operation. The purpose of the pre-wet step is to build a liquid film on the substrate. In various embodiments, the DI water may be introduced into the chamber as a steady-state jet stream. In other embodiments, the DI water may be introduced into the chamber as a pulsed jet stream. In still other embodiments, the DI water may be introduced into the chamber as a combination of a steady-state jet stream and a pulsed jet stream (e.g., either concurrently through various jets or alternating between steady state and pulsed jets).

For a specific exemplary embodiment, the skilled artisan can assume that the second rotatable shield 103 is rotating at the same speed but in the opposite direction. In other embodiments, the second rotatable shield 103 is rotating in the same direction as the first rotatable shield 101. In still other embodiments, the second rotatable shield 103 is rotating in either the same direction or the opposite direction as the first rotatable shield 101 and at either a higher or lower speed. Additionally, either the first 101 or the second shield 103 may be rotating at continuously or intermittently variable, programmable speeds and directions. The speeds (fixed or variable) and the directions (the same direction for both shields or having counter-rotations at the same or different times) can each be customized and depend on factors such as the substrate type and shape, cleaning chemistries employed, a level of cleanliness desired for a given substrate type, and other factors discernible to the skilled artisan.

Substantially simultaneously with the initial wetting step (e.g., at times of about 0 to about 2 seconds), the gas flow (e.g., ultra-pure nitrogen) is provided at operation 703 into the chamber 100 at a relatively low flow rate (e.g., in one embodiment, about 283 lpm or approximately 10 scfm, in other embodiments, less than about 575 lpm or approximately 15 scfm). The introduced gas is dispersed within the chamber 100 via the gas dispersion mechanisms 215, 217 (see FIG. 2). The gas dispersion mechanisms 215, 217 create a low-pressure, high-velocity flow of gas (e.g., nitrogen) proximate to the rotating vertical substrate. The low-pressure, high-velocity flow of gas facilitates the dehydration of the moisture-rich environment proximate to the rotating vertical substrate. According to the example of FIG. 7, the gas flow rate is maintained at this rate until about the second wetting cycle (at times of about 13 seconds to about 15 seconds) when the gas flow rate increases to about 1700 lpm (approximately 60 scfm) to about 2265 lpm (approximately 80 scfm). The gas flow is also exhausted from the chamber 100 at operation 707 at about the same time (or within several seconds either before or after the introduction of the gas at operation 703).

During the substrate cleaning operation, gas is dispensed into the chamber via a gas portion of the fluid manifold 305 (see FIG. 3) and a low flow dispense of gas is maintained that works on drying the volume proximate the substrate or the volume of the cavity surrounding the substrate. Although the gas flow does not need to start at the same time as a flow the liquid-based cleaning chemicals, the gas is dispensed prior to the end of the cleaning operation to begin a dehydration process during the cleaning operation so that excessive moisture does not saturate the volume proximate substrate and chamber volume during the cleaning operation.

Continuing with the cleaning operation, a high exhaust is pulled from the fabrication facility that is further augmented by an exhaust fan placed in the pump cabinet (not shown but readily understandable to a person of ordinary skill in the art). As shown in various figures, as the exhaust, tubes on both sides of the wafer pull exhaust they create a negative flow in the chamber that is balanced by both gas being dispensed from the central manifold and make-up clean dry air being pulled in from the filter units 501, 503 (see FIG. 5) above the chamber. By balancing both systems via pressure and flow control of the gas, an improved or optimum moisture control environment is achieved within the chamber during the cleaning and drying operations.

At approximately the same time that the gas flow rate is increased at about 13 seconds into the cleaning operation, the shields, and consequently the substrate, are ramped up in rotational speed to approximately 1500 to about 2200 rpm. Drying of the substrate is substantially performed via high speed spinning of the substrate while the area around the substrate is controlled by the central exhaust and gas dispense systems. Certain values of the exhaust are set as parameters into the control software so if, for example, the exhaust is out of a pre-programmed range, the system may enter into a default mode until corrected.

A skilled artisan will recognize that one limitation of an upper rotational speed is at least partially dependent on an overall dynamic balancing of the components of the inner and outer chambers, coupled with an overall balance of the substrate (e.g., an overall physical symmetry of the substrate, concentricity of mass balance homogeneity of the substrate, and a number of other factors recognizable to a skilled artisan).

As both shields and the substrate rotate at operation 705 during the cleaning operation, effluent coming from the vertical rotating substrate 119 is evacuated through the opening 125 (see FIG. 1) in the rotatable shields due to a centrifugal effect. In embodiments, one or both of the rotatable shields 101, 103 may now be rotated at a higher speed to further facilitate the evacuation and removal of the effluent from the substrate and the chamber 100. At substantially the same time, the low-pressure, high-velocity flow of gas substantially or completely removes liquid molecules from faces and edge(s) of (e.g., immediately proximal to) the rotating substrate 119. In specific exemplary embodiments, a solvent, such as isopropyl alcohol (IPA) vapor, can also additionally be introduced with nitrogen as the carrier gas when needed for certain applications that require IPA drying. Other types of surfactant may be used to reduce the surface tension of liquids remaining on the substrate 119 are known in the art.

At the end of the cleaning operation, the liquid streams (either steady-state or pulsating) emitted from the spray jets 219 (e.g., see FIG. 6) are stopped, the gas is continued for another time period (e.g., 15 seconds past the end of the wetting step at operation 701 to approximately 30 seconds in this example) to facilitate the drying operation that was started by the low-pressure, high-velocity flow of gas into the chamber 100.

To prevent the drying of the substrate prematurely, the jets may continue to be turned on spraying both sides and edge(s) of the substrate at a low pressure, just enough to keep the substrate wet. The low-pressure liquid prevents the drying of the substrate via evaporation while the high-flow gas-assisted exhaust dries the process chamber and the cavity proximate the substrate, assisted by a slower speed rotation of the shields.

A rotational speed of the spinning substrate is ramped up to a higher speed at operation 705 at the beginning of the wetting step and continues for several seconds longer after the flow of nitrogen is reduced or eliminated (e.g., to about 37 seconds in this example). The gas exhaust continues at operation 707 to coincide substantially with the spin operation 705. The chambers 100, 200 are then opened and the substrate 119 is removed from the clamping mechanism by a separate, clean end-effector (e.g., as opposed to the same end-effector used to place the "dirty" substrate) of the robot (not shown). In the above final step, the substrate is rotated at a high speed, thereby drying the substrate using centrifugal force. The shields rotating at high speed, coupled with a high exhaust, yield a water/chemical-mark free, or substantially mark free, and dry substrate.

As disclosed herein, in some embodiments, a curvature of the shield (see FIGS. 3 and 4) may be designed such that the effluent moves towards the outer edge (i.e., proximate the opening 125) of the shields and is removed via the opening 125 and into the outer chamber 200 and collected by the drain channel 213 (see FIGS. 2 and 3). In other embodiments, where the shields 101, 103 are straight but angled away from a direction of axial rotation of the shields (e.g., see FIG. 1), effluent is also evacuated from the chamber 100 in a similar fashion as described with regard to the curved shields. A speed of the rotatable shields can be increased to increase evacuation of the effluent from the chamber 100.

As will be recognized by a person of ordinary skill in the art, the high rotational-speed of the two rotatable shields 101, 103 creates a pressure differential between the substrate and the area around it that further facilitates the removal of both liquids and moisture away from the rotating substrate. The high-speed rotation of the substrate 119, coupled with the gas flow and rotation of the shields, removes substantially all effluent and moisture thereby drying the substrate without water/chemical marks or other particulate or film formation. The secondary gas (e.g., nitrogen) flow mechanism, described in more detail below with reference to the computational fluid dynamics (CFD) modeling portion of this disclosure, creates a gas barrier substantially preventing particulate migration into the vertical substrate cleaning and drying chamber 100 from the outer chamber 200.

As will further be recognized by the skilled artisan upon reading and understanding the disclosure provided herein, during the cleaning and the drying operations a speed of the rotatable shields can be manipulated to effect a volumetric removal of the effluent and vapor. The effective removal of all or substantially all of the effluent and vapor helps to produce a spot-free or substantially spot-free substrate at the end of the cleaning and drying operations. In other embodiments, an optional single-sided (or single-faced) cleaning operation may also be employed (with or without edge cleaning of the substrate). In still other embodiments, the substrate may be cleaned on alternate sides rather than cleaning both sides simultaneously.

The skilled artisan will appreciate that many operations, repetitions of operations, sequences of operations, and so on may be employed to develop a process recipe for a given substrate or industry. Therefore, the operations detailed with reference to FIG. 7 are given as an example only, and may vary considerably based on the needs of an end-user of the vertical substrate cleaning and drying mechanism disclosed herein. Further, each of the operations is programmable for a given substrate type and size. Moreover, each of the dynamic process parameters, such as spin speed, shield rotation speed, time of the spray for both DI water and chemicals, a droplet size of a pulsed-jet spray or variations thereof, can be designed for various substrate types, sizes, and applications.

Substrate-Holding Mechanism

Figure 8:
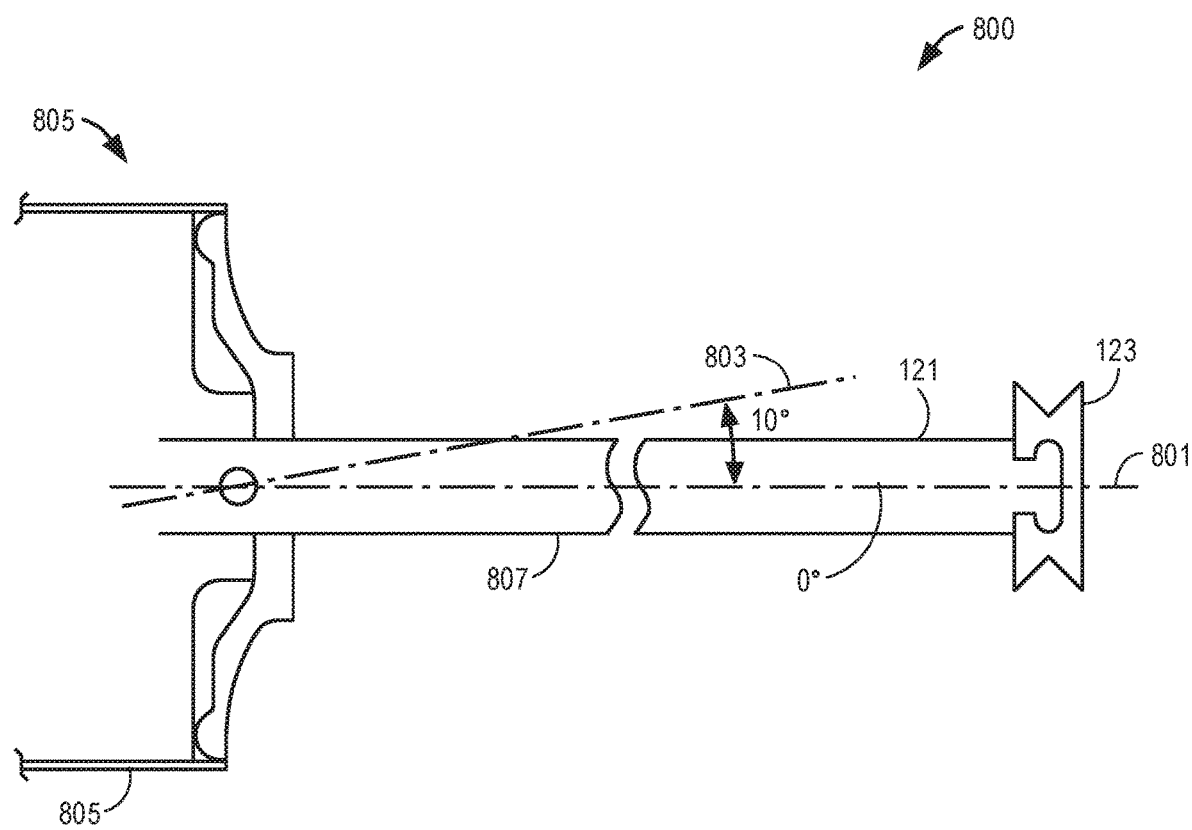
FIG. 8 shows an example of a separation diagram for a finger arm and finger-end cap combination for holding a substrate.

Referring now to FIG. 8, an example of a separation diagram 800 for a finger arm 121 and finger-end cap 123 combination for holding a substrate 119 (see FIG. 1, the substrate 119 is not shown in FIG. 8) is shown. Depending on a shape of the substrate used in the vertical substrate cleaning and drying mechanism, only one finger/end-cap combination needs to be movable away from the substrate to facilitate load and unload operations. For example, in an embodiment of the finger arm 121 and finger-end cap 123 combinations used for holding and clamping a circular substrate (e.g., a semiconductor wafer), there are three fingers holding the substrate with each of the fingers spaced apart from each other at about 120 degrees. In this example, only one of the finger arm 121 and finger-end cap 123 combinations need to be movable (although more than one finger may be movable to accommodate various combinations of end effectors of a robot (not shown).

As shown in FIG. 8, a movable finger 807 of the finger arm 121 and finger-end cap 123 combinations is coupled to a cam housing 805 (described in more detail below). The movable finger is in a normal operating position 801 of about 0° and in a first separated-position 803, in this example, at about 10°. The normal operating position 801 occurs when the finger arm 121 and finger-end cap 123 combination is in a clamping position i.e., when a substrate is being held within the finger/cap combinations) or an unloaded position. The separated position 803 occurs when the finger arm 121 and finger-end cap 123 combination is opened (i.e., away from the axial centerline 411 (see FIG. 4)) to facilitate loading or unloading a substrate (not shown in FIG. 8).

In an example where the substrate is non-circular (e.g., square), four or more finger arm 121 and finger-end cap 123 combination may be used to accommodate the substrate. In this example, two of the finger arm 121 and finger-end cap 123 combinations may be movable, gripping fingers to facilitate mounting and removal of the substrate. The other two fingers are fixed (i.e., stationary) in position. In general, any combination of movable, gripping fingers and stationary fingers can be designed to address different applications. One consideration, regardless of the number of fingers, is that the fingers be balanced around the axial centerline 411 (see FIG. 4) when combined with a substrate to reduce or eliminate vibrational effects caused by a rotating substrate during cleaning and drying operations.

Figure 9:
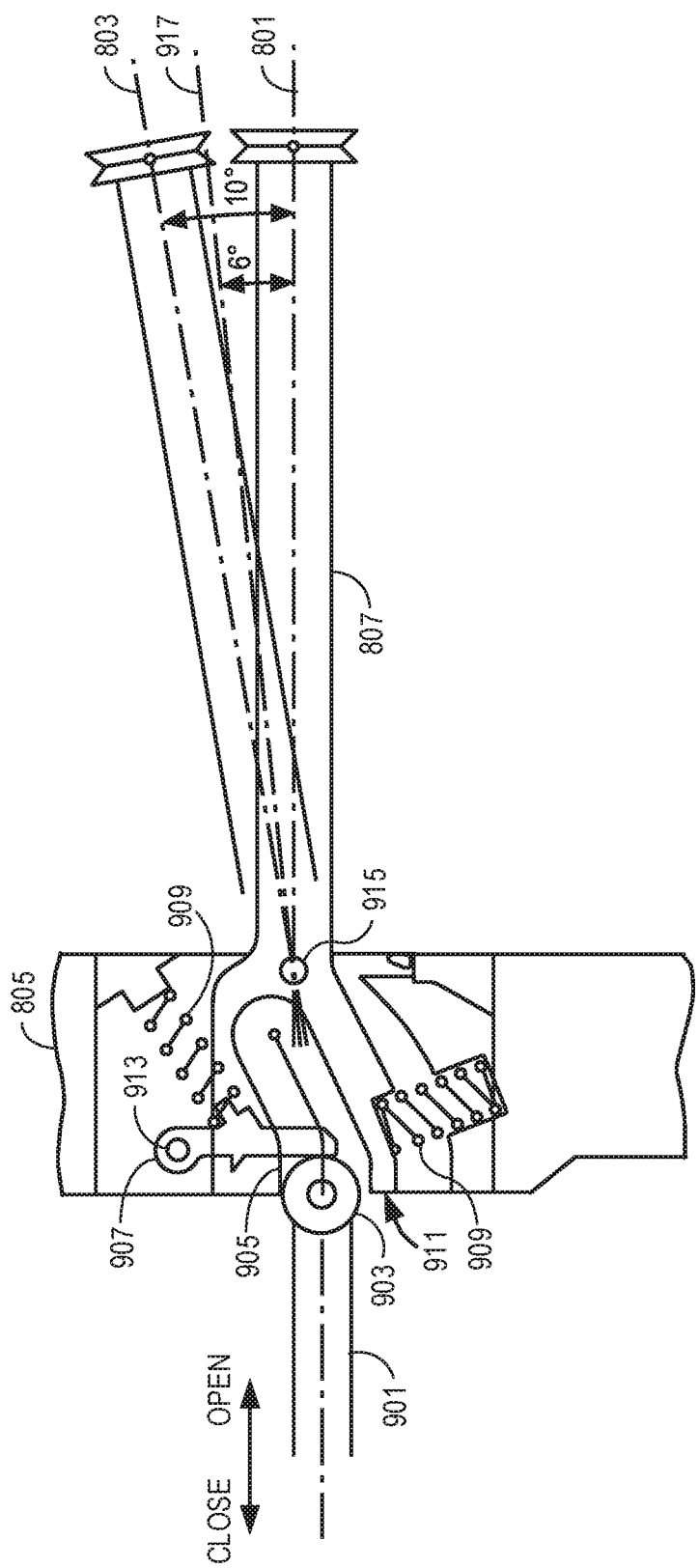
FIG. 9 shows an exemplary embodiment of a finger and cam housing mechanism for the finger arm and finger-end cap combination of FIG. 8.

With reference now to FIG. 9, an exemplary embodiment of a finger and cam housing mechanism 805 for the finger arm 121 and finger-end cap 123 combination of FIG. 8 is shown. The finger and cam housing mechanism 805 is shown to include a pusher 901, a cam follower 903, a cam-follower surface 905, a cam-return finger 907, one or more cam-return springs 909, and a lower cam-surface structure 911. When a substrate 119 (not shown) is to be either inserted or removed, the cam follower 903 slides over the cam-follower surface 905 and opens the movable finger 807 around a pivot point 915 to the first separated-position 803 of about 10°.

In alternative embodiments, the movable finger 807 may be opened to a second separated-position 917 of about 6°. In embodiments, the movable finger 807 may be opened to the first separated-position 803 when inserting a substrate and opened to the second separated-position 917 when removing a substrate (or vice-versa or various combinations of the above). The skilled artisan will recognize that the movable finger 807 may be pivoted to other angles, at least partially depending on an overall size of the shields, the chamber, the substrate, and other factors.

When the pusher 901 and the cam follower 903 retract, the movable finger 807 will be forced by the one or more cam-return springs 909, respectively acting on the cam-return finger 907 and the lower cam-surface structure 911 to close, thereby gripping (clamping) the substrate. An electrical (e.g., proximity or laser-based) or mechanical sensor (not shown) may be used to verify that the substrate is properly inserted into the combination of movable and stationary fingers.

In various process recipes, as described above with reference to FIG. 7, a substrate may rotate at 2200 rpm (or higher) during a drying operation. Depending on factors such as a physical size (e.g., diameter), mass of the substrate, and rotational speed, any offset of the movable and stationary fingers from being co-axial may create a dangerous wobble and vibration. The one or more cam-return springs 909 may then not be able to hold the substrate in place, thereby potentially resulting in a catastrophic failure (e.g., release and destruction of the substrate). To address this potential problem, a negative locking-mechanism (not shown in FIG. 9) engages an aperture 913 (e.g., an opening or hole) in the cam-return finger 907.

Figure 10A:
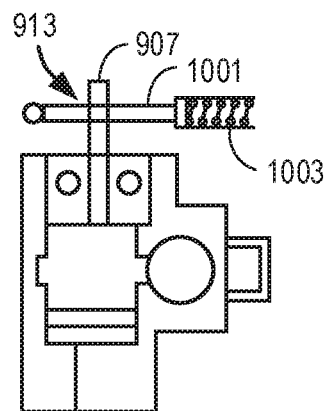
FIG. 10A shows an exemplary actuator mechanism used with the finger and cam housing mechanism of FIG. 9 to lock the substrate in place.
Figure 10B:
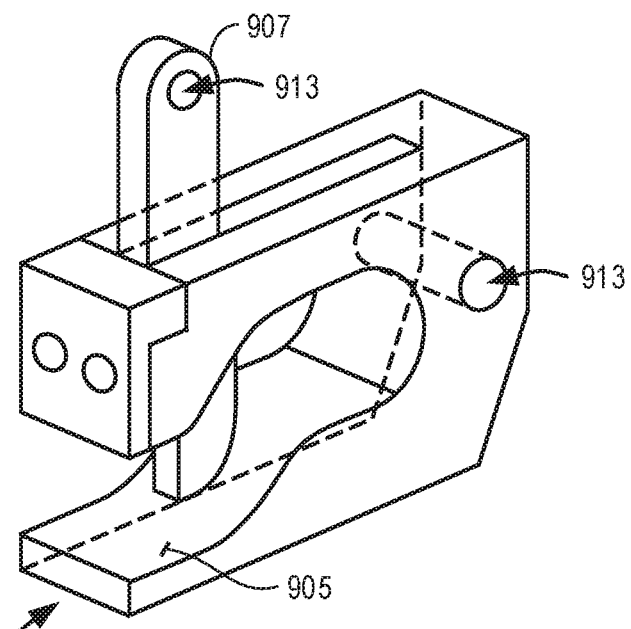
FIG. 10B shows a three-dimensional view of a portion of the cam housing mechanism of FIG. 9.

FIG. 10A shows an exemplary actuator mechanism 1001 used with the finger and cam housing mechanism 805 of FIG. 9 to lock the substrate in place. With concurrent reference to FIG. 9, in one embodiment, the actuator mechanism 1001 of FIG. 10A may engage the aperture 913 in the cam-return finger 907 when the combination of the pusher/cam follower 901, 903 is in the normal operating position 801 (e.g., the closed position), thereby locking the movable finger 807 in the normal operating position 801. The actuator mechanism 1001 may be, for example, operated by a small solenoid (not shown), pneumatic cylinder (not shown), or other linear-actuator mechanism known in the art. The actuator mechanism 1001 may be kept in a locked position by a small spring 1003. FIG. 10B shows a three-dimensional view of a portion of the cam housing mechanism 805 of FIG. 9.

Alternate Embodiments of the Vertical Substrate Cleaning and Drying Mechanism

Figure 11:
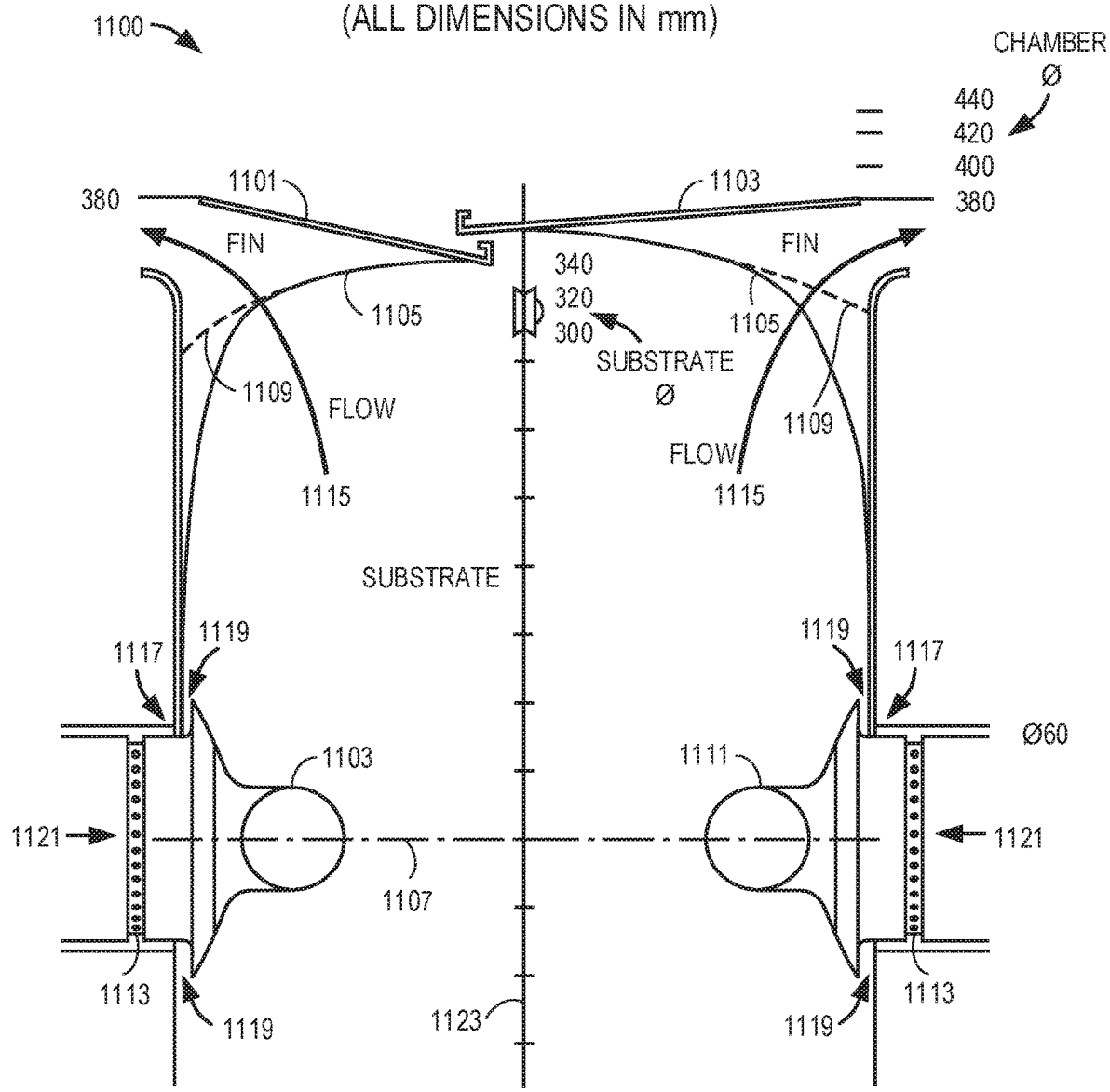
FIG. 11 shows a portion of an exemplary alternative chamber-design to the vertical substrate cleaning and drying chamber of FIG. 1.

FIG. 11 shows a portion of an exemplary alternative chamber-design to the vertical substrate cleaning and drying chamber 100 of FIG. 1. FIG. 11 may be considered as a side-exhaust chamber design as described below. FIG. 11 is shown to include, in this embodiment, a master side 1110 and a slave side 1120 (see FIG. 12). As described above with regard to FIG. 1, in one embodiment, the slave side 1120 of the chamber 1100 moves away from the fixed, master side 1110 of the chamber 1100 to facilitate substrate mounting and removal onto the finger arm 121 and finger-end cap 123 combinations. Although many of the fluid mechanical concepts may be similar to chamber of FIG. 1, the alternative chamber-design 1100 relies on having a left-side fin 1101 and a right-side fin 1103 each having a reverse slope as compared with the rotatable shields of the chamber of FIG. 1.

For example, an angle of the fins 1101, 1103 (relative to normal of a centerline location 1123 of a vertical location of the substrate (not shown)) may be from about 3° to about 15° or more. The fins 1101, 1103 may overlap each other as shown, or, alternatively, may touch or nearly touch (e.g., within a few millimeters) each other is shown with regard to FIG. 12, described below. If the fins 1101, 1103 actually touch, the skilled artisan will understand that both of the fins 1101, 1103 will rotate in the same direction at the same rotational speed.

The fins 1101, 1103 may be mechanically coupled to a rotational mechanism (not shown but understandable to a skilled artisan and similar to or the same as the rotatable shields of FIG. 1) by a number of support structures 1105. The support structures may be continuous around an entire periphery of the fins 1101, 1103 (with reference to an axial centerline 1107), or may, in another embodiment, comprise separate support arms located at two or more locations around the periphery of the fins 1101, 1103. If the support structures 1105 comprise a continuous structure, an area 1109 near an exhaust area 1115 of the alternative chamber-design 1100 includes a number of apertures, openings, slots, or other non-continuous portions of the support structures 1105 such that gases and liquids may readily be exhausted from the chamber 1100. All dimensions are exemplary only and are given in millimeters.

FIG. 11 is also shown to include gas-dispersion devices 1111 that each include a porous area 1113 containing a number of openings to disperse gas around a periphery of an incoming gas (e.g., ultra-pure nitrogen) along a gas inlet channel 1121 (such as a tube having a circular or other cross-section) In various embodiments, the gas-dispersion devices 1111 may be screwed, press-fit, chemically adhered, or otherwise affixed to accept the incoming gas from the gas inlet channel 1121. The gas from the porous area 1119 diverts the incoming gas from impinging onto a face of the substrate (not shown in FIG. 11). Thus, the gas-dispersion devices 1111 may function the same as or similar to the gas-dispersion mechanisms 215, 217 of FIG. 2. The gas dispersion mechanisms are explained in more detail below in the computational fluid dynamics (CFD) analysis portion of this disclosure.

Figure 12:
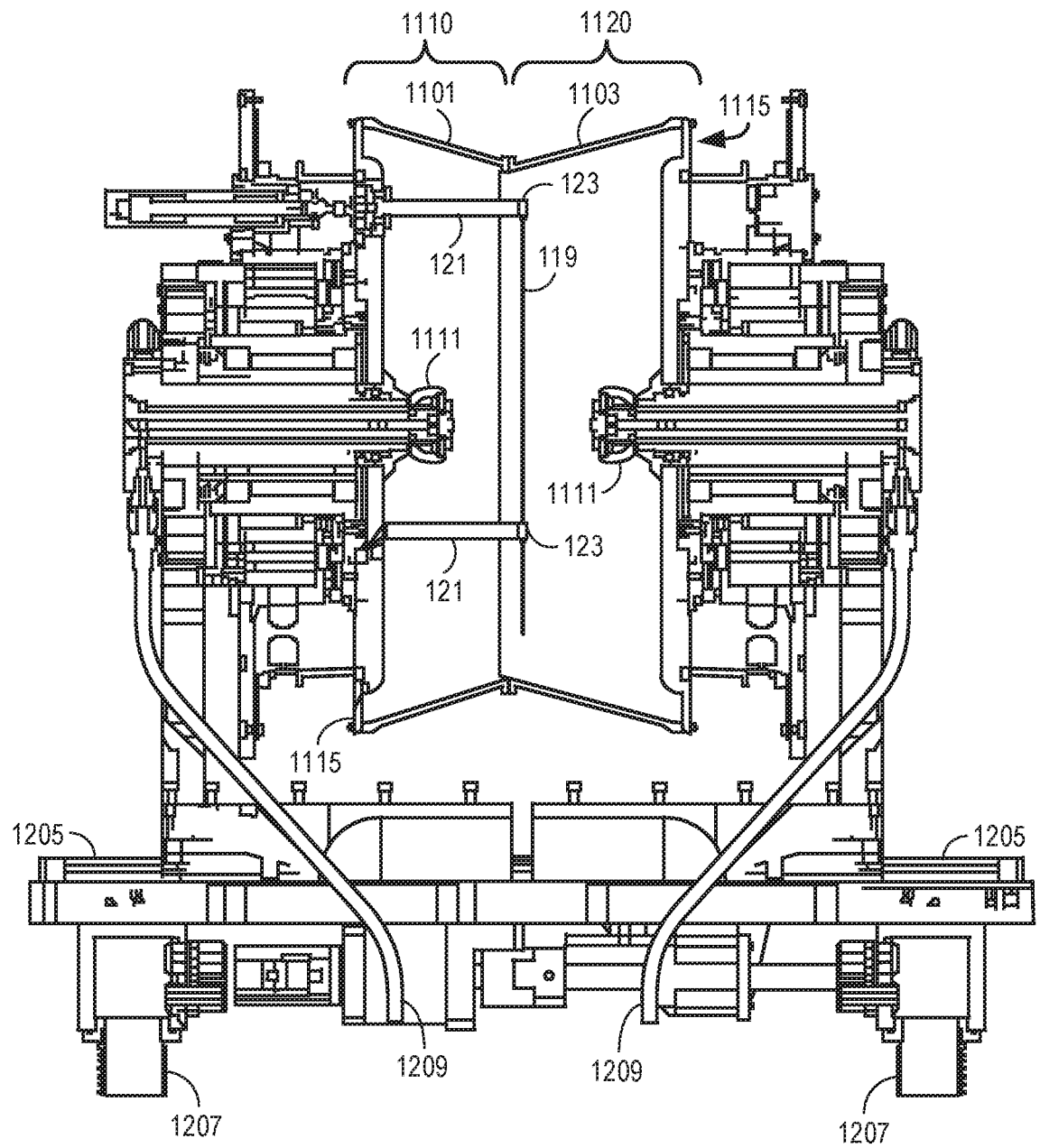
FIG. 12 shows an exemplary cross-section of an interior portion of a vertical substrate cleaning and drying chamber having the alternative chamber-design of FIG. 11.

FIG. 12 shows an exemplary cross-section of an interior portion of a vertical substrate cleaning and drying chamber having the alternative chamber-design 1100 of FIG. 11. In FIG. 12, the left-side fin 1101 and the right-side fin 1103 may come into close contact with one another or may optionally touch each other, as noted above. If the fins 1101, 1103 actually touch, the skilled artisan will understand that both of the fins 1101, 1103 will rotate in the same direction at the same rotational speed.

FIG. 12 is also shown to include gas supply lines 1209, a plurality of liquid exhaust lines 1207, and linear tracks 1205 to open, for example, the slave side 1120 of the chamber 1100 to facilitate mounting and removal of a substrate 119. Additionally, the alternative chamber-design 1100 may be placed within an outer chamber, such as the outer chamber 200 of FIG. 2. The outer chamber for the alternative chamber-design 1100 may also include an optional drain channel 213.

Figure 13:
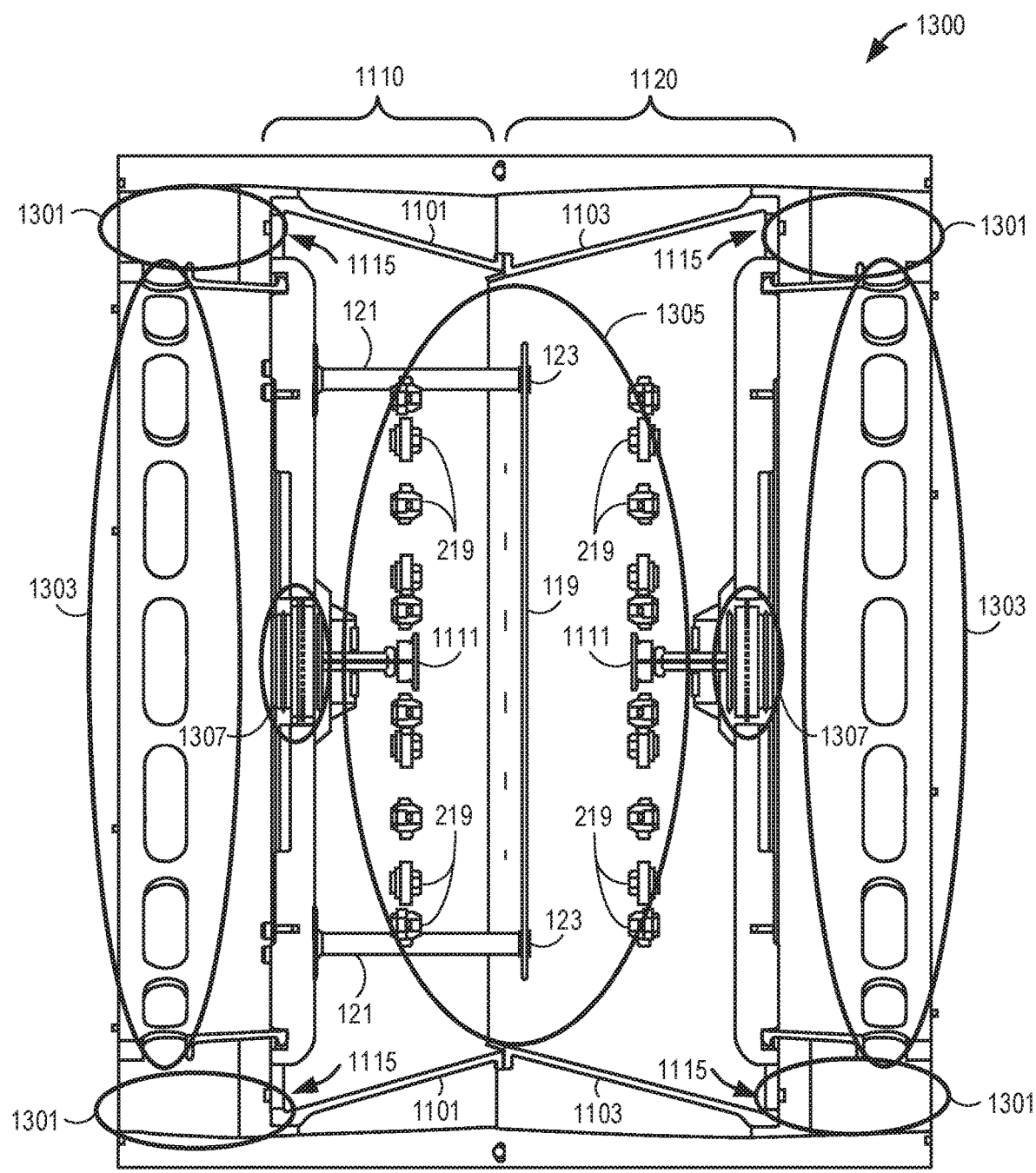
FIG. 13 shows additional details of an exemplary cross-sectional interior portion view of the alternative chamber-design of FIGS. 11 and 12.

FIG. 13 shows additional details of an exemplary cross-sectional interior portion view 1300 of the alternative chamber-design 1100 of FIGS. 11 and 12. The inner-chamber view 1300 of FIG. 13 is shown to include drain areas 1301, effluent and gas-exhaust areas 1303, a chamber inner-core area 1305, and air-knife separation areas 1307 (an inner portion of the gas-dispersion devices 1111 of FIG. 11). The air-knife separation areas 1307 may be balanced with gas inlets 111, 113 (see, e.g., FIG. 3) of the central incoming gas supply system (coming from the center of the fluid manifold 305 (FIG. 3) such that these systems do not work against each other during cleaning and drying operations.

FIG. 13 also shows spray jets 219, as described above with reference to FIG. 2 and FIG. 6, and their relative placement with regard to the substrate 119. Functions of the various elements are similar to or the same as those described herein with regard to items having similar element numbers. Other elements are described in more detail below.

Figure 14A:
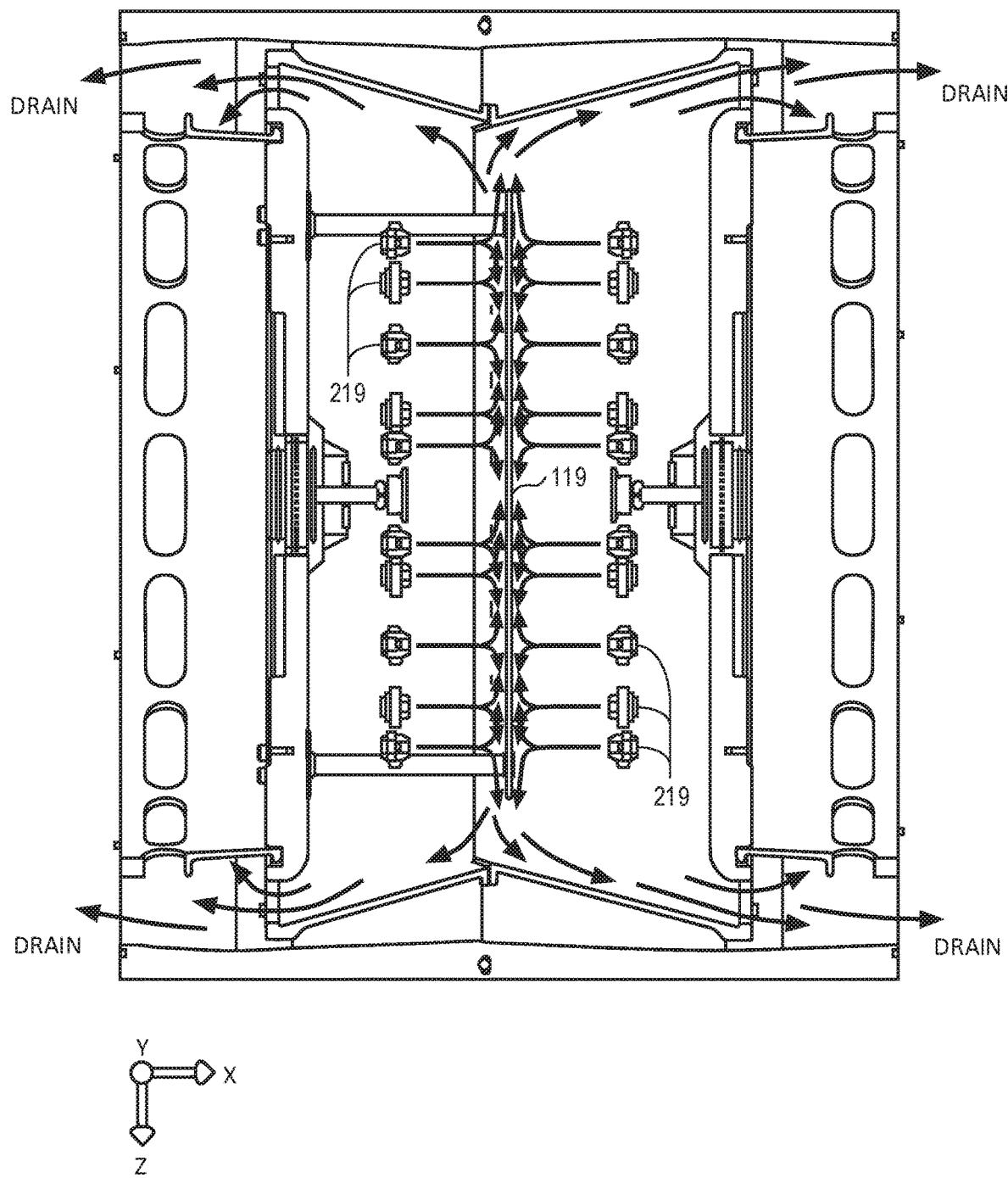
FIG. 14A shows an example of the cross-sectional view of FIG. 13 and additionally shows liquid stream-lines during a substrate cleaning or drying operation.

For example, with concurrent reference to FIG. 13, FIG. 14A shows the example of the cross-sectional inner-chamber view 1300 and additionally shows an example of approximate locations of liquid stream-lines that occur during a substrate cleaning or drying operation. In FIG. 14A, cleaning fluid (e.g., DI water or chemical-based cleaning liquids) are emitted (continuous or pulsed) from the spray jets 219 toward both faces and edges of the substrate 119, which is rotating (spinning) at the same speed, or accelerating at the same rate, as the master side 1110 of the chamber 1100. Depending on a design of the spray jets 219, the cleaning fluid can be formed into circular, elliptical, flat (e.g., fan-shaped), or a variety of other shapes, or combinations of shapes, as known in the art. As described above, the slave side 1120 may be rotating (or counter-rotating) at the same speed, or accelerating at the same rate, or different speeds or rates, or various combinations thereof, as the master side 1110. Effluents and gases, if any, are then discharged through the drain areas 1031 and into the outer chamber (not shown in FIG. 14A) and into liquid exhaust ports (not shown in FIG. 14A) and into a facility drain in an environment in which the vertical substrate cleaning and drying mechanism is located.

Figure 14B:
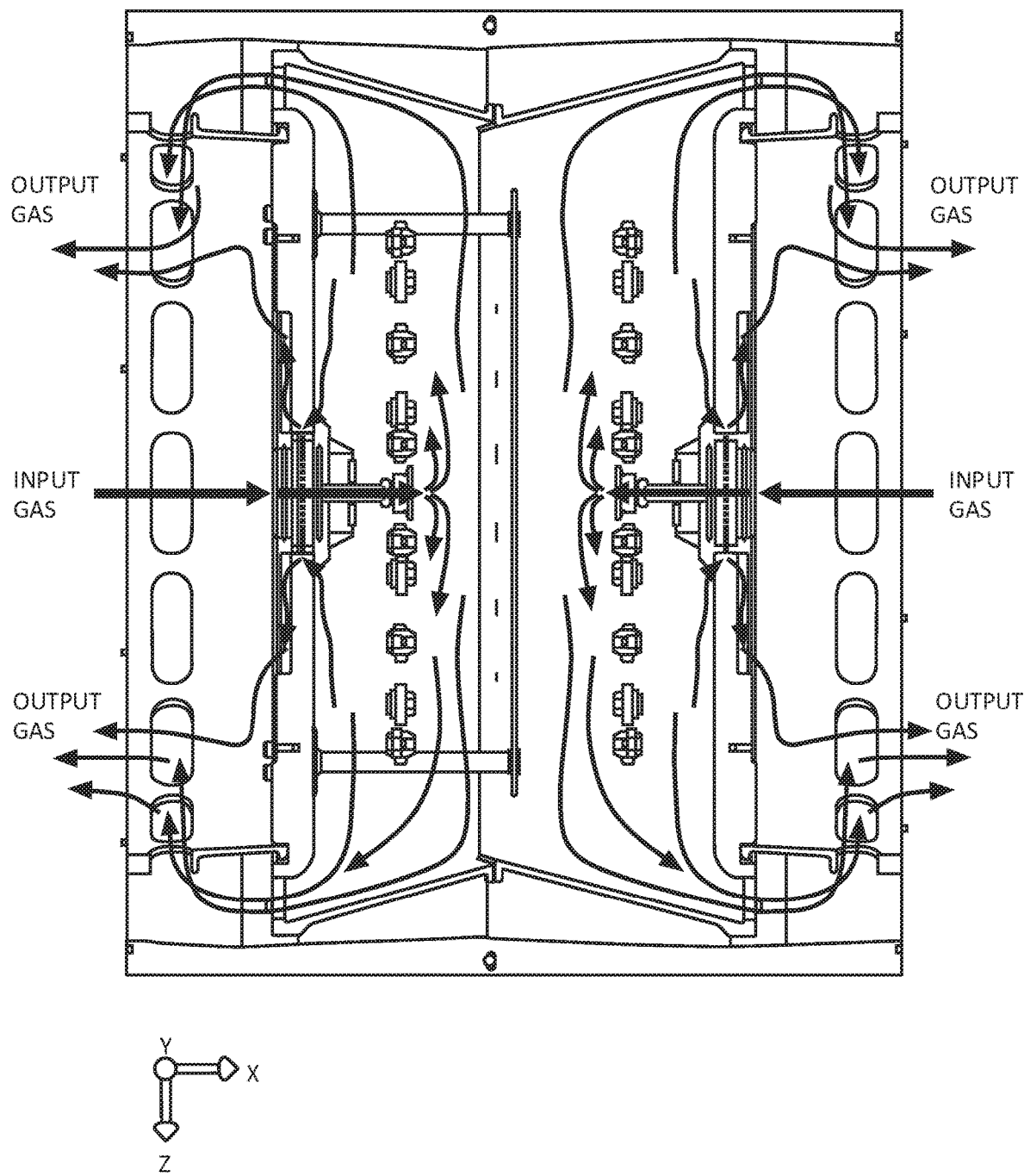
FIG. 14B shows an example of the cross-sectional view of FIG. 13 showing gas stream-lines during a substrate cleaning or drying operation.

With continued concurrent reference to FIG. 13, FIG. 14B shows an example of the cross-sectional inner-chamber view 1300 of FIG. 13 and additionally shows approximate locations of an example gas stream-lines that occur during a substrate cleaning or drying operation. As shown in the specific exemplary embodiment of FIG. 14B, gas (e.g., ultra-pure nitrogen) is introduced into the chamber inner-core area 1305 through the gas-dispersion devices 1111 and circulates within the chamber volume to draw effluents away from the substrate 119 and out the exhaust areas 1115. Exhausting the gases, and other effluents, is further aided by turbine fins (see FIG. 6) located within in the gas-exhaust areas 1303. The turbine fins are located on and rotate at the same speed and direction as the fins in the master side 1110 and the slave side 1120 of the chamber 1100.

Figure 15:
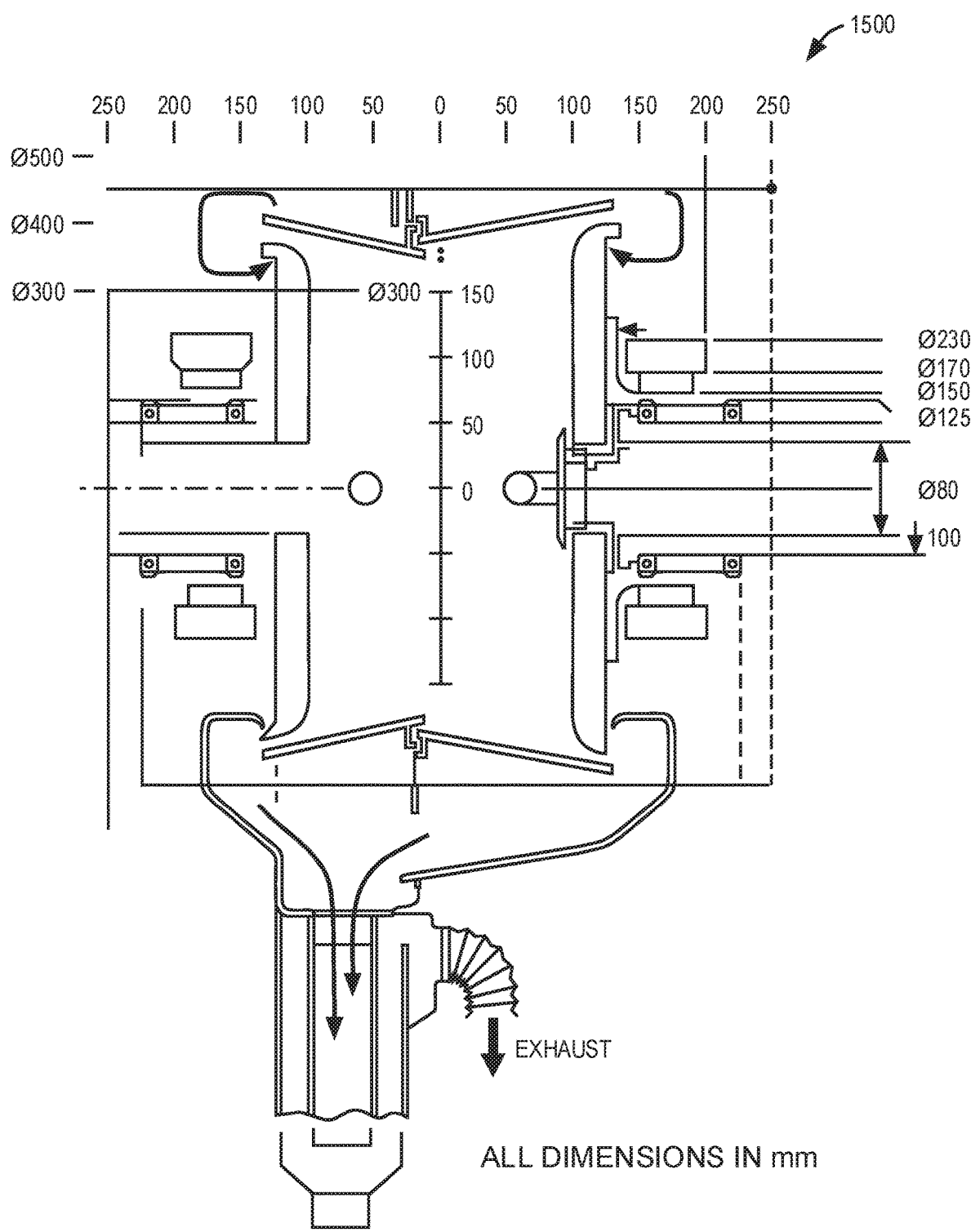
FIG. 15 shows exemplary dimensions of a schematic of an interior portion of a chamber of the alternative chamber-design 1100 of FIGS. 11 and 12.

FIG. 15 shows exemplary dimensions of a schematic of an interior portion 1500 of a chamber of the alternative chamber-design 1100 of FIGS. 11 and 12. For example, FIG. 15 shows an example of a chamber design for a 300 mm semiconductor wafer. However, the skilled artisan will recognize that the exemplary dimensions may be readily modified to accommodate substrate of various sizes and cleanliness requirements for those substrates. Therefore, the person of ordinary skill in the art will recognize that the physical dimensions provided within FIG. 15 are exemplary only. (As noted above, the term as used herein, "exemplary" refers to one example or a set of examples only, and should not necessarily be construed as the preferred or best way to implement portions of the disclosed subject matter disclosed herein.) Consequently, the physical dimensions given by FIG. 15 should be viewed as aiding the skilled artisan in explaining and understanding the disclosed subject matter and therefore should not be seen as limiting the scope of the disclosed subject matter.

Figure 16A:
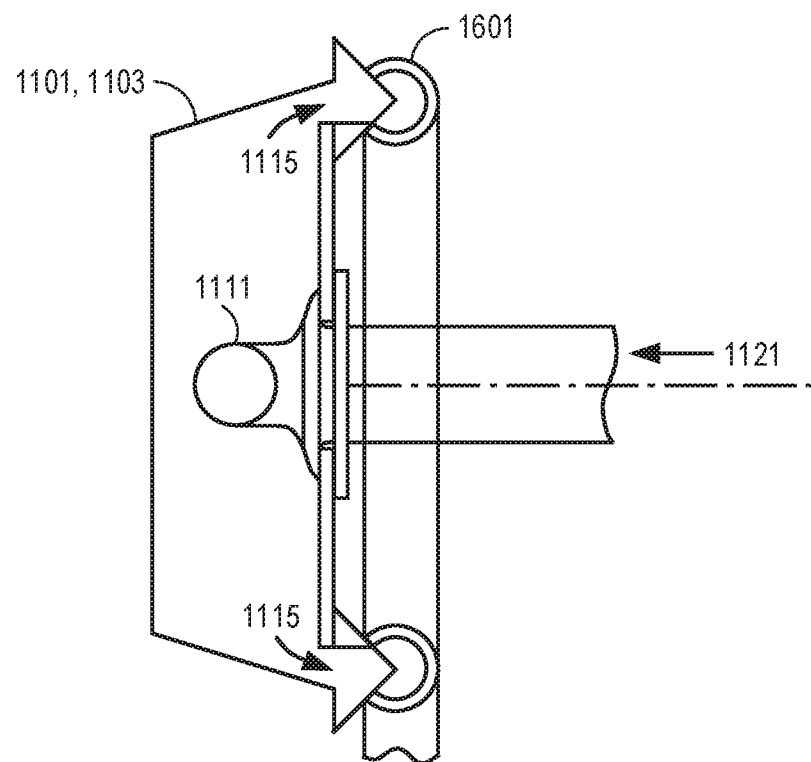
FIGS. 16A and 16B show alternative or optional embodiments for removing effluents from the chamber-design of FIGS. 11 and 12.
Figure 16B:
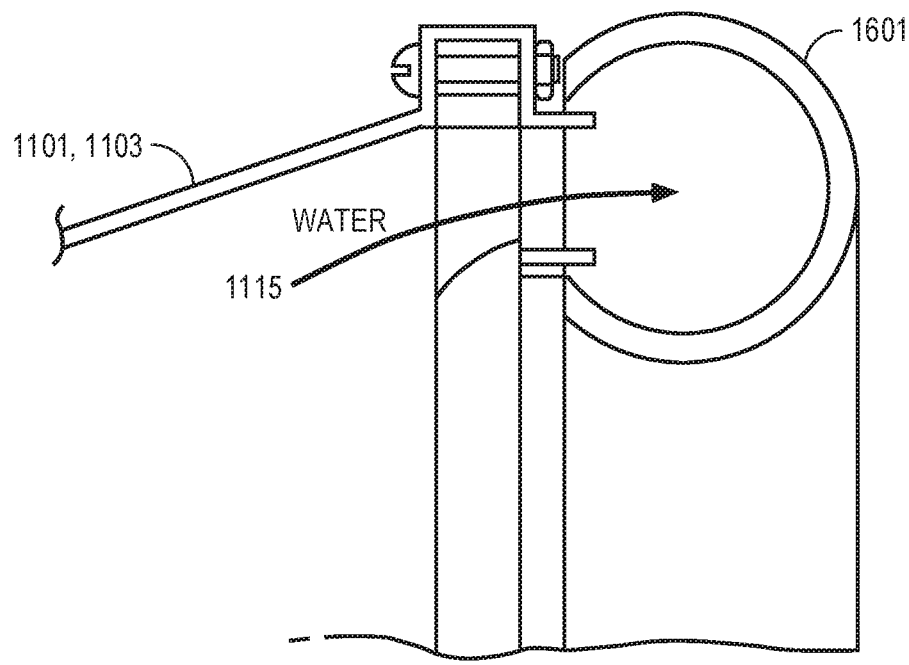

FIGS. 16A and 16B show alternative or optional embodiments for removing effluents from the chamber-design of FIGS. 11 and 12. For example, instead of or in addition to the effluent draining directly into the outer chamber 201 (see, for example, FIGS. 2 and 3), the effluent may be directed into a drain channel 1601. The drain channel 1601 may be constructed of, for example, polyvinyl chloride (PVC) or a number of other materials described herein or known in the art. The drain channel 1601 can be considered, in one embodiment, to be a toxoid, that drains directly into the outer chamber 201 (see FIG. 2) or directly into liquid exhaust ports, such as the fluid exhaust port 507 of FIG. 5. In other embodiments, the drain channel 1601 may be used in conjunction with the optional drain channel 213 of FIG. 2.

Figure 17:
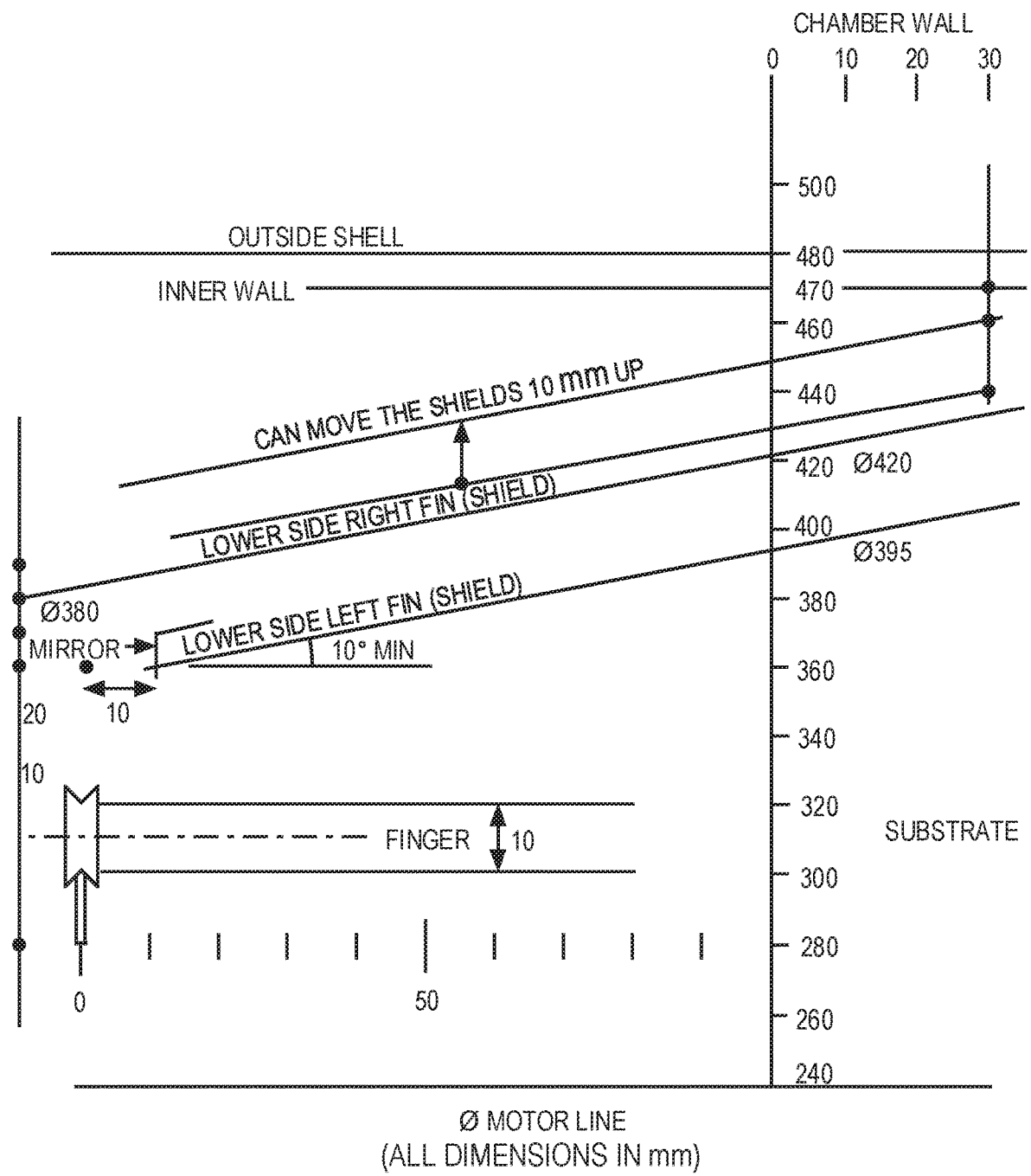
FIG. 17 shows an exemplary embodiment of a nomogram used to determine a relationship between various physical dimensions of the vertical substrate cleaning and drying mechanism disclosed herein.

With concurrent reference to FIGS. 2 and 3, FIG. 17 shows an exemplary embodiment of a nomogram 1700 used to determine a relationship between the outside shell of the chamber, the inner wall of the outside chamber, a lower side of the left-side fin 1101 (left rotatable shield) and right-side fin 1103 (right rotatable shield) at an exemplary angle of 10°, a size of the substrate (e.g., a diameter of a wafer), and a distance from the finger-end caps at various distances from a vertical wall of the chamber. All dimensions are given in millimeters. The skilled artisan, upon reading and understanding the disclosure provided herein, will recognize how to use the nomogram 1700 to design a vertical substrate cleaning and drying chamber for a given substrate geometry.

Examples of CFD Analyses

In efforts to direct gas and liquid flows more efficiently within the vertical substrate cleaning and drying chamber, dozens of physical arrangements and dimensions of the chamber were considered with numerous iterations of each of the combinations of arrangements and dimensions conducting simulations using computational fluid dynamic (CFD) analysis using, for example, finite element and finite volume analysis.

Initially, the simulations were conducted using a two-dimensional model, later expanding to using three-dimensional (3D) models, and still later, conducting simulations in 3D and adding a fourth dimension, time (thereby producing time-accurate animations to further aid in flow, pressure, vorticity magnitude, Q-criterion, and other fluid parameters of interest known to a skilled artisan).

The arrangements and dimensional changes for each of the iterations included varying the diameter of the chamber, changing distances between walls of the chamber (and consequently changes in distances from the substrate to the chamber walls), changing gas flow rates, gas flow directions, and various placements of exhaust paths. Additional details were added to the various designs of the chambers. However, the description below allows the skilled artisan to appreciate the factors to be considered for further CFD modeling, simulation, and analysis for a particular set of shapes and dimensions for a substrate of interest.

Figure 18:
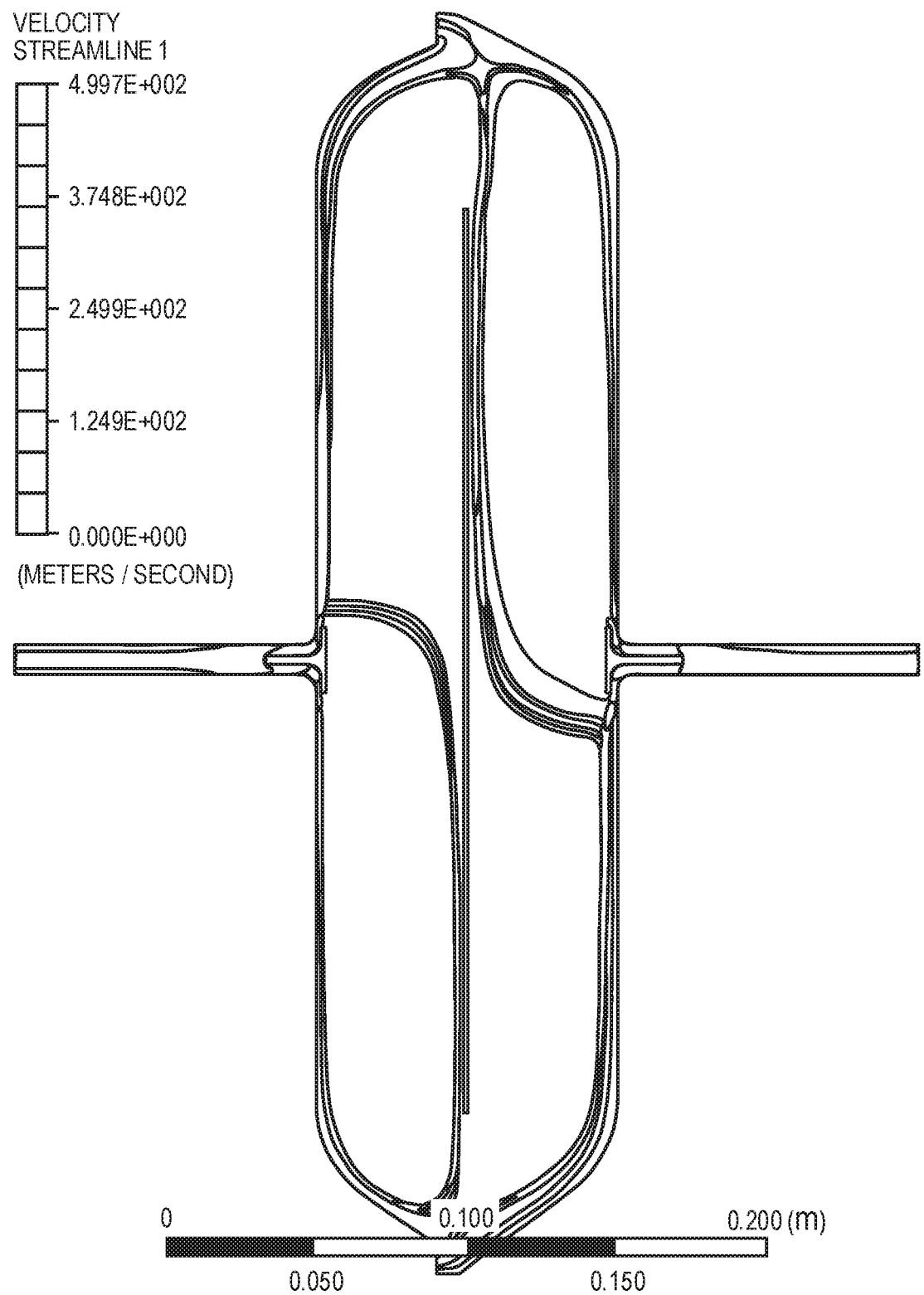
FIG. 18 shows various eddy viscosity contours from an example of a computational fluid dynamic (CFD) analysis based on the various exemplary physical dimensions of a portion of the vertical substrate cleaning and drying chamber mechanism shown in FIG. 4.

For example, with concurrent reference to FIG. 4 (the center-exhaust chamber design described above), FIG. 18 shows gas velocity streamlines units of meters/second) from an example of CFD analysis based on the various exemplary physical dimensions of a portion of the vertical substrate cleaning and drying chamber mechanism shown in FIG. 4. FIG. 18 shows good dispersion of the stream lines from the gas inlet streams, across opposing faces of the substrate, to the openings (e.g., gas exhaust areas) of the rotatable shields.

Figure 19:
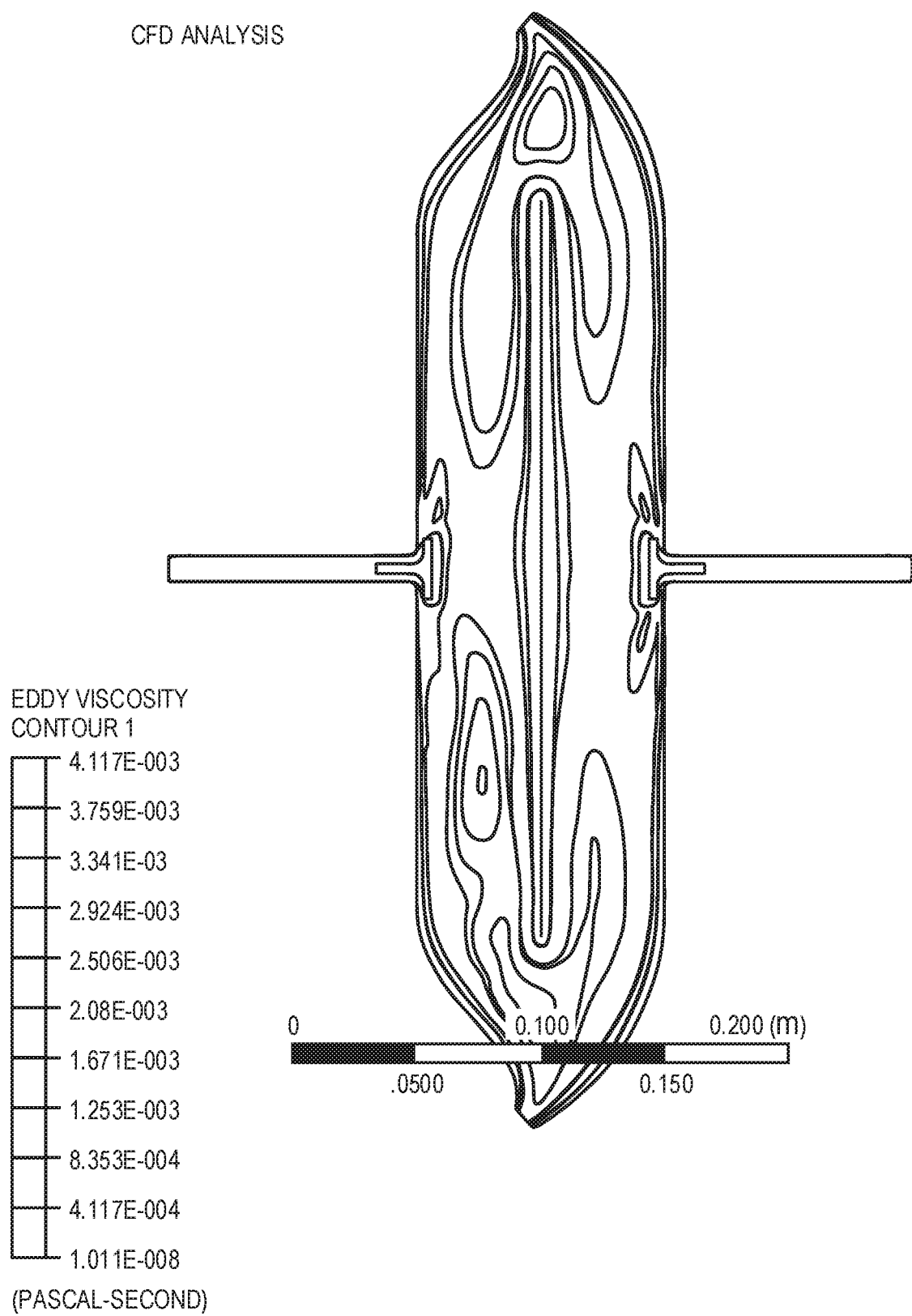
FIG. 19 shows various eddy viscosity contours from an example of CFD analysis based on the various exemplary physical dimensions of a portion of the vertical substrate cleaning and drying chamber mechanism shown in FIG. 4.
Figure 20:
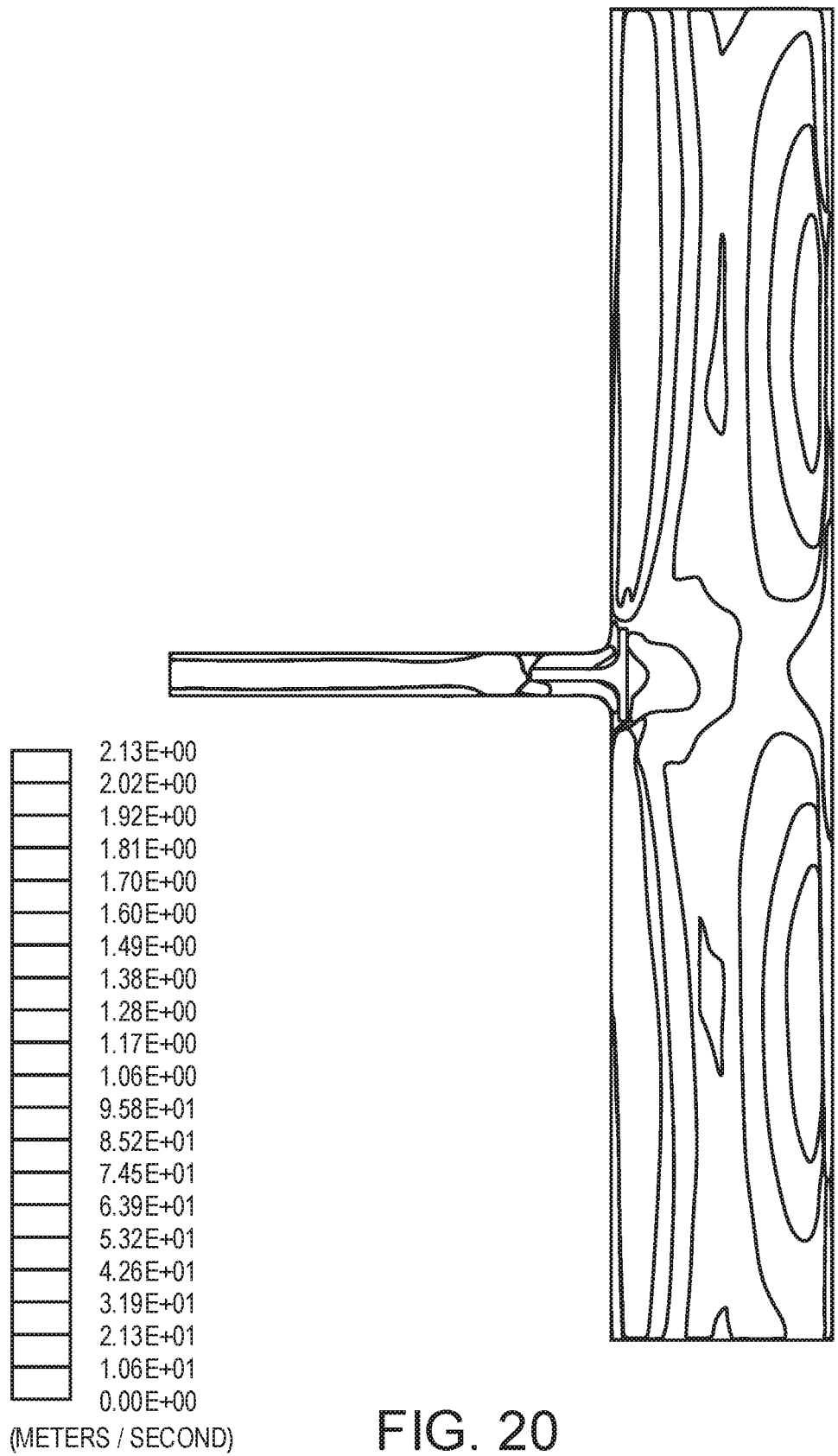
FIG. 20 shows contours of velocity magnitude for a portion of the chamber mechanism shown in FIG. 4.
Figure 21:
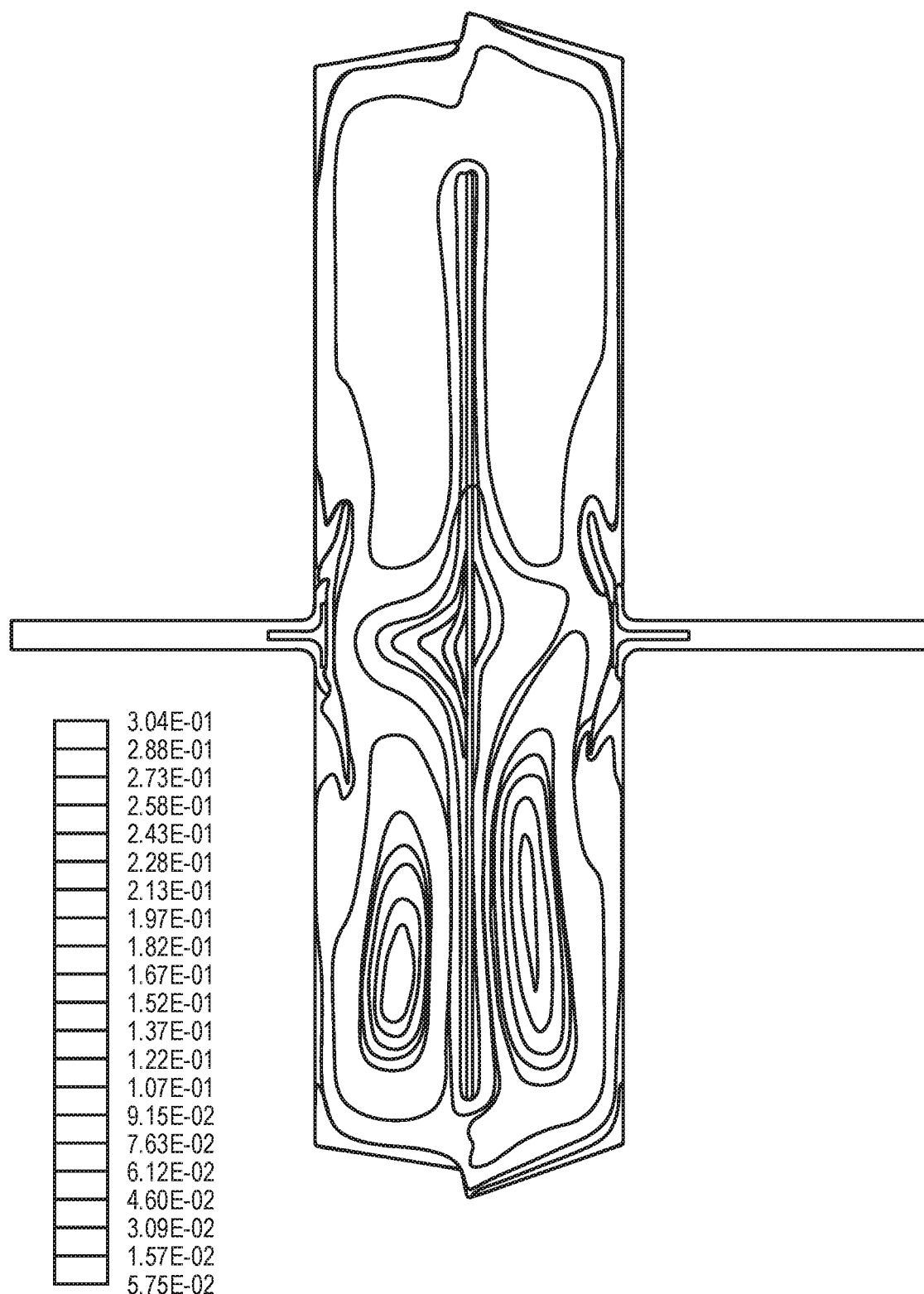
FIG. 21 shows a simplified CFD diagram indicating contours of turbulent viscosity based on another design model.

With continuing reference to FIG. 4, FIG. 19 shows various eddy viscosity contours (in units of Pascal-second (also known as Newton-second/meter$^2$ or kilogram/meter-second)) from an example of CFD analysis based on the various exemplary physical dimensions described above with reference to FIG. 18. Additionally, FIG. 20 shows contours of velocity magnitude (in units of meters/second) for a portion of the chamber mechanism shown in FIG. 4. FIG. 21 shows a simplified CFD diagram indicating contours of turbulent viscosity (also in units of Pascal-second) based on another design model (not shown).

Figure 22:
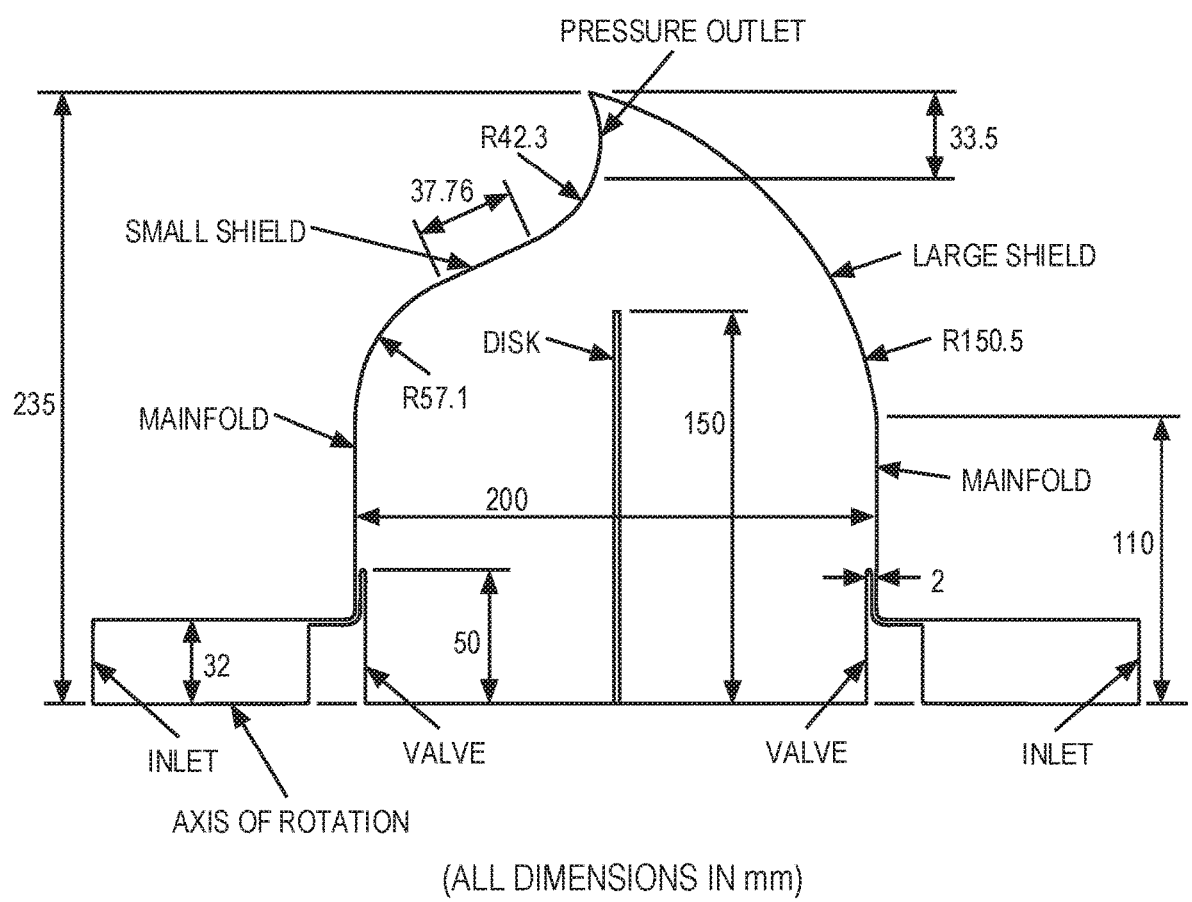
FIG. 22 shows a portion of another exemplary chamber design considered for CFD analysis having a greater distance between chamber sidewalls than the chamber design used in FIG. 4.

Referring now to FIG. 22, a portion of another exemplary chamber design was considered for CFD analysis having a greater distance between chamber sidewalls is shown (all dimensions are in millimeters) to consider any effects on cleaning and drying efficacy. In FIG. 22, the sidewalls are about 200 mm apart, whereas, in FIG. 4, the sidewalls are about 100 mm apart (neglecting a thickness of the substrate in both FIG. 4 and FIG. 22).

Figure 23:
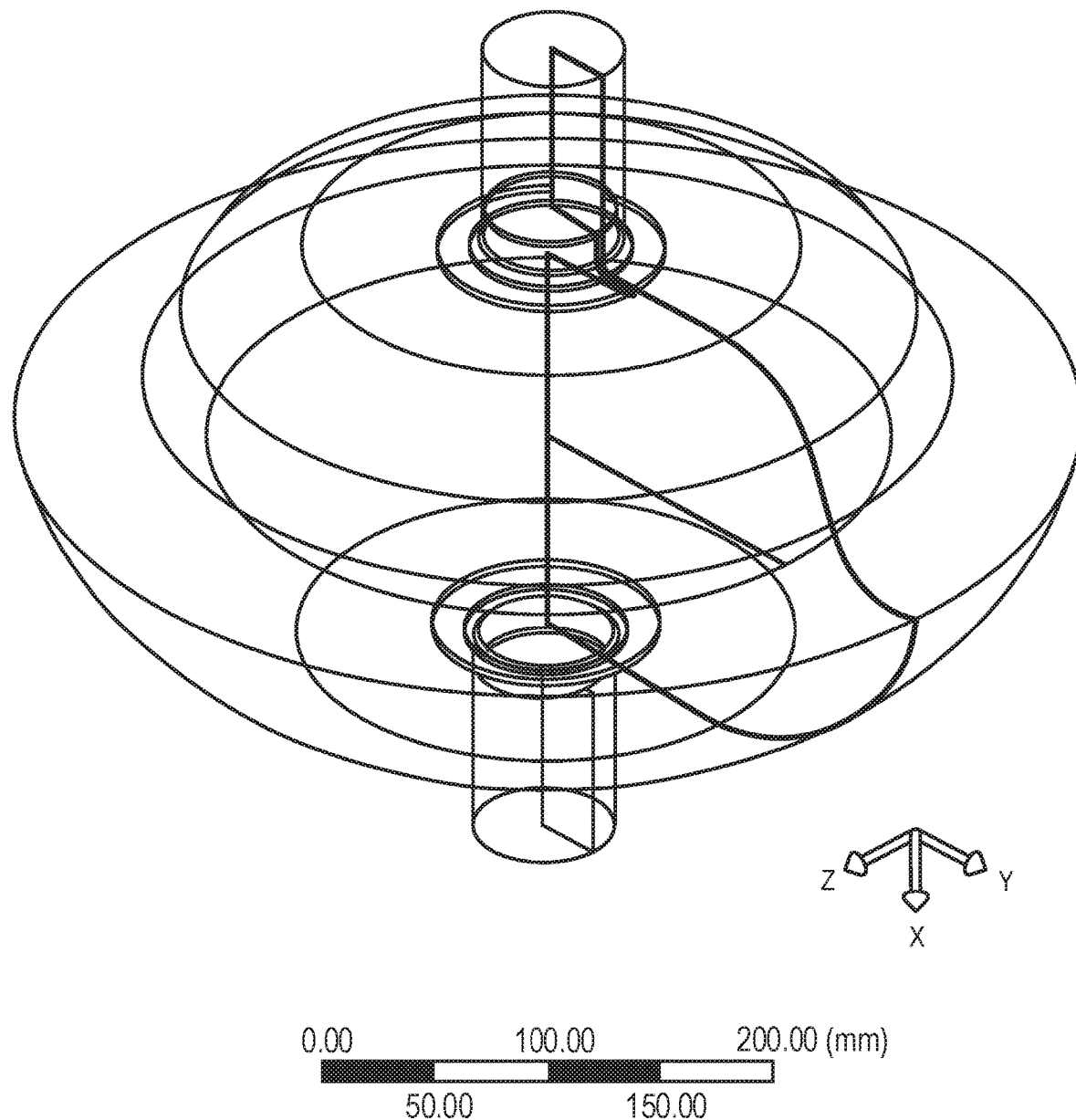
FIG. 23 shows an example of a full 3D simulation basis model for the exemplary chamber design of FIG. 22.

FIG. 23 shows an example of a full 3D simulation basis model for the exemplary chamber design of FIG. 22. Full CFD analyses (not shown) for various fluids (e.g., liquid and gases) and various processes (e.g., both cleaning and drying operations) were run using the exemplary chamber design of FIG. 22 as well. Numerous other shield and fin designs, sizes (e.g., distance between chamber side walls and overall diameter), angles, and curvatures were considered as well.

Figure 24:
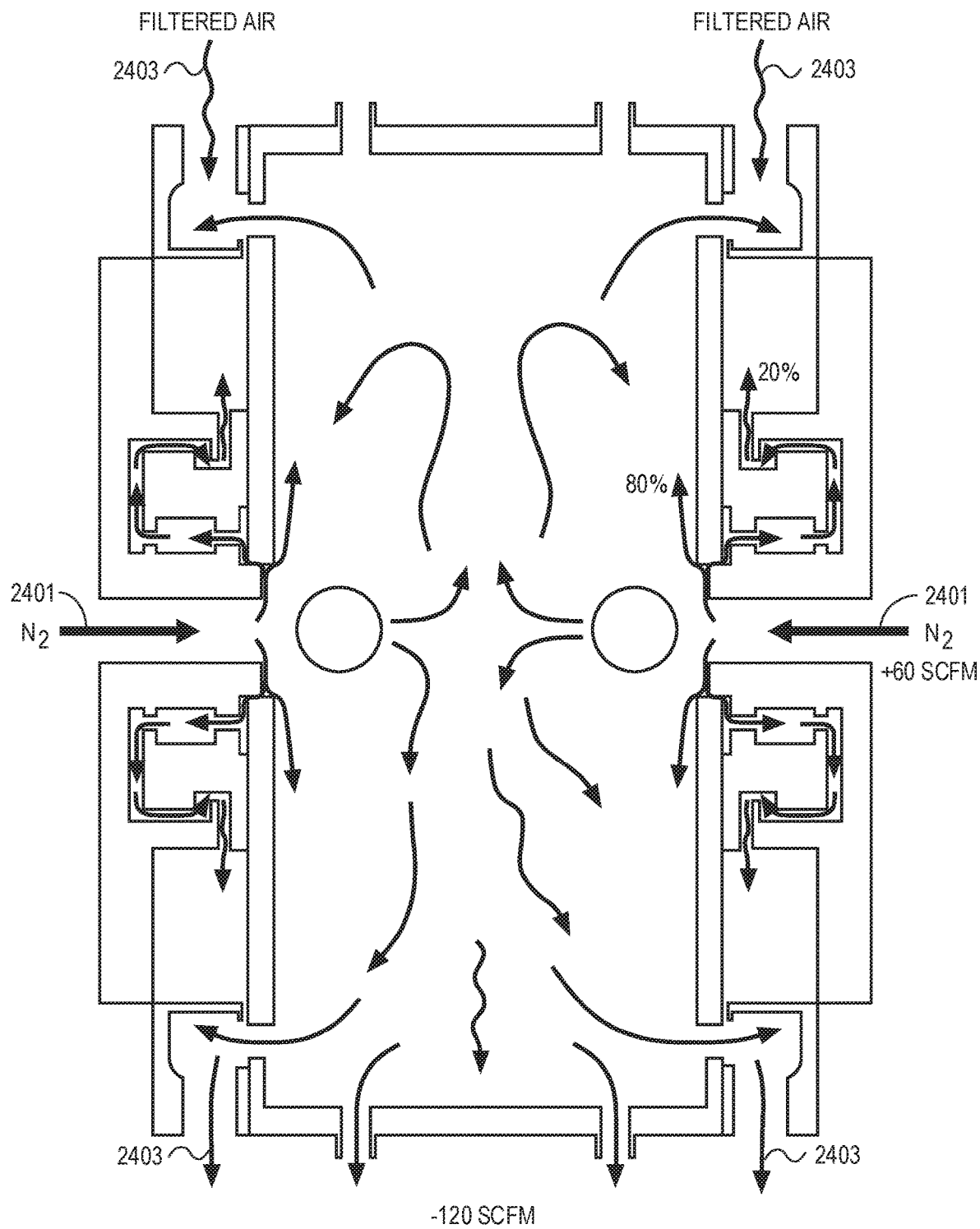
FIG. 24 shows an exemplary gas flow diagram for a modified version of the side-exhaust chamber of FIG. 11.

Additionally, additional CFD analyses were conducted based on modifications of the alternative, side-exhaust chamber design of FIG. 11. For example, FIG. 24 shows an exemplary gas flow diagram for the modified side-exhaust chamber. FIG. 24 shows an exemplary embodiment where nitrogen gas is introduced into the chamber from each side inlet 2401 at about 1700 lpm (approximately 60 scfm). Approximately 80% of the gas enters the main portion of the chamber containing the substrate (not shown) to assist in drying the substrate as well as removing effluent and moisture within the chamber. The remaining approximately 20% allows a portion of the incoming nitrogen to prevent or substantially reduce contamination or particulates from various mechanical components (e.g., the bearings 303 of FIG. 3) from migrating into the process chamber through key seal-areas.

The air knife system is balanced with the central nitrogen system (coming from the center of the fluid dispense manifold) so that these systems do not work against each other during the cleaning and drying cycle.

Additionally, filtered air 2403 enters by, for example, a venturi effect from the topside provided by the first filter unit 501 and the second filter unit 503 (see FIG. 5). The gas is exhausted through a lower part 2405 of the chamber, carrying excess moisture from the chamber and the substrate during a drying operation.

Overall, based on the descriptions provided above with regard to various physical models and a resulting set of CFD analyses, the skilled artisan will recognize how to apply the various models and simulations for a given substrate shape and dimension to prepare a suitable chamber design.

As will now be recognizable to a person of ordinary skill in the art, upon reacting and understanding the material provided herein, the disclosed subject matter contains multiple advantages over both the prior art as well as contemporaneous techniques used in substrate cleaning and drying processes. In addition to other advantages disclosed herein, additional advantages include, for example:

A vertically-oriented substrate allows a configuration of the rotatable shields to remove effluent and moisture rapidly from both sides, as well as the edges, of the substrate, more efficiently as compared with a horizontal orientation of the substrate, which tends to retain moisture, effluents, and particulates on at least an upper surface of the horizontally-oriented substrate; and The disclosed subject matter allows a closed system wherein the atmosphere inside the chamber can readily be controlled; whereas in the case of a horizontally-oriented substrate cleaning and drying system of the prior art, the process is typically open to the atmosphere thereby increasing the potential of particulates to be added back on the wafer during cleaning and drying.

Consequently, for at least the reasons stated above and throughout the disclosure, the disclosed subject matter is both novel and non-obvious since, for example, it provides cleaning and drying of the vertically-oriented substrate in the same chamber, without having to move the substrate from one chamber to another thereby saving time and avoiding unnecessary, potentially contaminating, handling steps. The disclosed system is a contactless cleaning and drying system for substrates since no contact is made on either face of the substrate and only limited contact on the edges of the substrate. Consequently, harsh mechanical substrate cleaning systems of contemporary cleaning systems are avoided completely. Further, the mechanisms defined herein for evacuating fluids (liquids and gases) as well as moisture from a process chamber are new, novel, and non-obvious.

The disclosed subject matter solves at least two major problems: First, all surfaces of a substrate are cleaned substantially simultaneously (e.g., front, back, and edge(s)) with identical or nearly-identical efficiency. Currently, there is no contemporaneous mechanism that can perform the operations disclosed herein. Secondly, the disclosed subject matter removes extremely small (e.g., sub-nanometer-level particles (e.g., Angstrom-level particle sizes) and other contaminants) from the process chamber. The sub-nanometer-level cleaning capability allows users to achieve sub-25 nm, or smaller, integrated circuit manufacturing with a high single-pass cleaning efficiency.

Additional advantages of the disclosed cleaning and drying chamber include one or more of the added benefits listed below. For example, the chamber can include an additional flexibility to allow for only one side of the substrate cleaned using a chemical, or DI water, or combination of chemical and DI water, while the other side can be sprayed with an inert gas to prevent the chemicals/liquids from overlapping onto the other side.

In addition, or as a separate operation, while the frontside and backside of the substrate are cleaned with jets of a chosen cleaning fluid or DI water (for example), a special single or multiple spray edge-jets can be directed separately at edge(s) of the substrate to perform special cleaning functions or enhanced edge cleaning. The edge-jets can also be fed with the same or differing cleaning fluids than the fluids fed to the jets directed at the surfaces (faces) of the substrate.

The disclosed cleaning and drying chamber may dispense a plurality of cleaning liquids or other fluids thereby providing a variety of cleaning options to remove particles, residues, organic contaminants, inorganic contaminants, and metallic contaminants from all surfaces of the substrate. Further, the disclosed cleaning and drying chamber can include separate, switchable drains to facilitate removal of incompatible effluents (e.g., acid, basic, or solvents). Such switchable drains are known in the art.

Further, the disclosed cleaning and drying chamber can dispense two or more different gases that can be used for substrate drying and to eliminate or reduce, for example, static charges in the process chamber.

Additional IPA vapor or other types of surfactants can be introduced into the disclosed cleaning and drying chamber to assist in thinning a liquid layer on the substrate to facilitate drying of the substrate. A combination of spin speed or acceleration and IPA vapor or surfactant introduced into the chamber can further yield a dry or substantially dry substrate for applications that do not require, or cannot tolerate, a high spin-speed drying operation.

In various embodiments, the substrate can include, for example, any of various types of substrates used in the semiconductor and allied industries (which may be referred to herein as "semiconductor substrates," or "wafers," or simply "substrates"). Substrate types may therefore include silicon substrates (e.g., wafers) or substrates based on other elemental semiconductors, compound wafers (e.g., from Groups or others), thin-film head assemblies, polyethylene-terephthalate (PET) films deposited or otherwise formed with a semiconducting layer, or numerous other types of substrates known independently in the art. Also, the substrate may comprise a region of a semiconductor material formed over a non-semiconductor material, or vice-versa. For ease of understanding the activities and designs presented herein, the substrate may be considered to be a silicon wafer. Upon reading and understanding the disclosure provided herein, a person of ordinary skill in the art will understand how to modify various component, designs, geometries, and so on to account for other types of substrates.

One of ordinary skill in the art may recognize that the designs may include other components, at least some of which are described herein. However, several of these components are not shown in the figures, so as not to obscure details of the various embodiments described.

The various illustrations of the methods and apparatuses are intended to provide a general understanding of the structure of various embodiments and are not intended to provide a complete description of all the elements, materials, and features of the apparatuses and methods that might make use of the structures, features, and techniques described herein.

The apparatuses and systems of the various embodiments may be suitable for and used in, for example, the fabrications of electronic circuitry used in high-speed computers, communication and signal processing circuitry, single- or multi-processor modules, single or multiple embedded processors, multi-core processors, data switches, and application-specific modules including multilayer, multi-chip modules, or the like. Such devices may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

A person of ordinary skill in the art will appreciate that, for this and other methods (e.g., substrate cleaning and drying operations) disclosed herein, the activities forming part of various methods may be implemented in a differing order, as well as repeated, executed simultaneously, with various elements substituted one for another. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. Many modifications and variations can be made, as will be apparent to a person of ordinary skill in the art, upon reading and understanding the disclosure. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

Also, as used herein, the term "or" may be construed in an inclusive or exclusive sense unless otherwise explicitly noted or operationally defined. Additionally, although various exemplary embodiments described above focus on various general and specific exemplary embodiments, the embodiments are merely given for clarity in disclosure, and thus, are not limited to a particular type or design of a vertical substrate cleaning and drying mechanism or system.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

The Following Numbered Examples are Embodiments of the Disclosed Subject Matter

Example 1

A substrate cleaning and drying apparatus includes a vertical substrate holder configured to hold and rotate a substrate vertically at various speeds; an inner shield and an outer shield configured to surround the vertical substrate holder during operation of the apparatus, with each of the inner shield and the outer shield being configured to operate independently in at least one of rotational speed and direction from the other shield; and a front-side spray jet array and a back-side spray jet array, each of the front-side spray jet array and the back-side spray jet array being configured to spray at least one fluid onto at least one face of the substrate.

Example 2

The apparatus of Example 1, wherein the front-side spray jet array and the back-side spray jet array are configured to spray at least one fluid onto both sides of the substrate and edges of the substrate substantially concurrently.

Example 3

The apparatus of Example 1 or Example 2, wherein the substrate cleaning and drying apparatus has a center exhaust between the inner shield and the outer shield for removing effluents.

Example 4

The apparatus of Example 1 or Example 2, wherein the substrate cleaning and drying apparatus has a side exhaust on at least one of the inner shield and the outer shield for removing effluents.

Example 5

The apparatus of any one of the preceding Examples, further comprising an outer chamber to contain process effluents.

Example 6

The apparatus of any one of the preceding Examples, wherein an outer chamber includes a drain channel to collect liquid evacuated from the vertical substrate cleaning and drying chamber.

Example 7

The apparatus of any one of the preceding Examples, further comprising at least one turbine disk coupled to at least one or more of the rotatable shields.

Example 8

The apparatus of Example 7, wherein the at least one turbine disk is configured with slots placed at various points near a periphery of the turbine disk to increase fluid-removal efficiency.

Example 9

The apparatus of Example 7, wherein the at least one turbine disk is configured with slots placed at one or more angles to increase fluid-removal efficiency Example 10

The apparatus of any one of Examples 1 to 6, wherein the apparatus is to clean both faces (sides) of the substrate, as well as the edge(s) of the substrate, simultaneously.

Example 11

The apparatus of any one of Examples 1 to 6, wherein at least one array of the front-side spray jet array and the back-side spray jet array includes spray jets arranged to deliver a continuous-liquid spray of one or more liquids to the substrate.

Example 12

The apparatus of any one of Examples 1 to 6, wherein at least one array of the front-side spray jet array and the back-side spray jet array includes spray jets arranged to deliver a pulsed-liquid spray of one or more liquids to the substrate.

Example 13

The apparatus of any one of Examples 1 to 6, wherein at least one array of the front-side spray jet array and the back-side spray jet array includes spray jets arranged to deliver at least one or both of continuous-liquid sprays and pulsed-liquid sprays of one or more liquids to the substrate.

Example 14

The apparatus of any one of Examples 13 to 16, wherein the one or more liquids includes one or more combinations of deionized (DI) water or liquid cleaning chemicals.

Example 15

The apparatus of any one of the preceding Examples, wherein the front-side spray jet array and the back-side spray jet array are configured to spray both faces (sides) and edge(s) of the rotating vertical substrate simultaneously during a cleaning operation.

Example 16

The apparatus of Example 12 or Example 13, wherein the pulsed-liquid spray jets are considered as gasless pulsed-jets.

Example 17

The apparatus of Example 16, wherein a diaphragm pump (e.g., a membrane pump) is utilized to produce gasless pulsed-jets.

Example 18

The apparatus of Example 16, wherein a three-diaphragm pump is used to produce a variety of sizes, velocities, and/or numbers of process-liquid droplets from the gasless pulsed-jets.

Example 19

The apparatus of Example 16, wherein one or more diaphragm pumps having two, four, or more diaphragms are used to produce gasless pulsed-jets.

Example 20

The apparatus of Example 16, where a diaphragm pump having a single diaphragm with only one chamber (e.g., a single-sided diaphragm pump) is used to produce a gasless pulsed-jet.

Example 21

The apparatus of any one of Examples 17-20, wherein the diaphragm pump is coupled to a variable-frequency drive to supply power to the diaphragm pump.

Example 22

The apparatus of Example 21, wherein the variable-frequency drive having a 1 Hz to 10 Hz frequency range is used to produce atomized droplets.

Example 23

The apparatus of any one of Examples 16 to 22, wherein the gasless pulsed-jet is combined with different sizes and shapes of nozzles on the front-side spray jet array and the back-side spray jet array.

Example 24

The apparatus of Example 22, wherein a kinetic-energy level imparted by each of a variety of atomized droplets produced by the pulsed-liquid spray jets is determined.

Example 25

The apparatus of Example 24, wherein the kinetic energy depends, at least partially, on a droplet size, a density of the liquid in the droplet (e.g., a total mass of the droplet), and a velocity of the droplet.

Example 26

The apparatus of Example 25, wherein the determination of the kinetic-energy level is further determined by a pressure required to dislodge a given particle size from the substrate.

Example 27

The apparatus of any one of the preceding Examples, further comprising one or more secondary gas flow devices to create a gas barrier to prevent or substantially reduce particulate migration into the inner (process) chamber from the outer chamber.

Example 28

The apparatus of any one of the preceding Examples, wherein at least one of the inner shield and the outer shield is configured to move laterally away from the other shield to increase an opening between the shield to insert and remove the substrate into or from the substrate cleaning and drying apparatus.

Example 29

The apparatus of any one of the preceding Examples, wherein peripheral edges of the inner shield and the outer shield each have one or more angles.

Example 30

The apparatus of Example 29, wherein the peripheral edges of the inner shield and the outer shield have a plurality of angles comprising various straight portions.

Example 31

The apparatus of Example 29 or Example 30, wherein the peripheral edges of the inner shield and the outer shield have one or more angles from about ±3" to about ±15°.

Example 32

The apparatus of Example 29 or Example 30, wherein the peripheral edges of the inner shield and the outer shield have one or more angles from about ±1° to about ±3°.

Example 33

The apparatus of Example 29 or Example 30, wherein the peripheral edges of the inner shield and the outer shield have one or more angles from about ±15° to about ±45° or more.

Example 34

The application of Example 30, wherein each of the straight portions has a different angle.

Example 35

The apparatus of Example 34, wherein the straight portions increase in angle as edges of the shields approach an opening.

Example 36

The apparatus of any one of Examples 1 to Example 28, wherein peripheral edges of the inner shield and the outer shield are curved.

Example 37

The apparatus of any one of the preceding Examples, wherein a larger of the inner shield and the outer shield extends over the smaller shield.

Example 38

The apparatus of any one of the preceding Examples, wherein at least one or both of the inner shield and the outer shield includes a labyrinth lip at an outermost peripheral edge to remove most or all fluid droplets.

Example 39

The apparatus of any one of the preceding Examples, wherein at least one or both of the inner shield and the outer shield includes a profile of an outermost peripheral edge such that the fluid droplets cannot collect above the substrate during an operation of the substrate cleaning and drying apparatus.

Example 40

The apparatus of any one of the preceding Examples, wherein the substrate is held within approximately ±0.1 degree to approximately ±1 degree from vertical.

Example 41

The apparatus of any one of Example 1 to Example 39, wherein the substrate is held within approximately ±2 degrees from vertical.

Example 42

The apparatus of any one of Example 1 to Example 39, wherein the substrate is held within approximately ±5 degrees from vertical. In still other embodiments,

Example 43

The apparatus of any one of Example 1 to Example 39, wherein the substrate is held within approximately ±10 degrees from vertical.

Example 44

The apparatus of any one of the preceding Examples, further comprising finger caps mounted to finger arms to hold the substrate.

Example 45

The apparatus of Example 44, wherein the finger caps are shaped like rollers.

Example 46

The apparatus of either Example 44 or Example 45, wherein the finger caps are non-rotatably mounted to a respective finger arm.

Example 47

The apparatus of any one of Example 44 to Example 46, wherein the finger caps are shaped to have a V-groove into which the substrate is placed during cleaning and drying operations.

Example 48

The apparatus of any one of Example 44 to Example 46, wherein the finger caps are shaped to have a U-groove into which the substrate is placed during cleaning and drying operations.

Example 49

The apparatus of Example 47 or Example 48, wherein a profile of the groove is designed such that it ensures that the substrate can self-align when placed in the grooves by an end-effector of a robot.

Example 50

The apparatus of Example 49, wherein the profile of the groove is shaped and sized such that only edges of the substrate are in contact with portions of the groove such that faces of the substrate are not in contact with the groove.

Example 51

The apparatus of Example 49, wherein the profile of the groove is sized and shaped such that no portion of the faces of the substrate are covered by the groove such that the faces of the substrate are fully exposed to sprays from the front-side spray jet array and the back-side spray jet array.

Example 52

The apparatus of any one of the preceding Examples, further comprising a special single spray edge-jet or multiple spray edge-jets to be directed separately at edge(s) of the substrate to perform special cleaning functions or enhanced edge cleaning.

Example 53

The apparatus of Example 52, wherein the single spray edge-jet or the multiple spray edge-jets can also be fed with the same or differing cleaning fluids than the fluids fed to the jets directed at the surfaces (faces) of the substrate.

Example 54

The apparatus of any one of the preceding Examples, further comprising a first-side gas dispersion mechanism and a second-side gas dispersion mechanism to direct at least one of liquids and liquid vapors within the vertical substrate cleaning and drying chamber.

Example 55

The apparatus of Example 54, wherein the first-side gas dispersion mechanism and the second-side gas dispersion mechanism direct at least one of liquids and liquid vapors away from the substrate during a drying operation.

Example 56

The apparatus of Example 54 or Example 55, wherein the first-side gas dispersion mechanism and the second-side gas dispersion mechanism are configured to disperse and redirect any incoming gas through a first-side gas inlet and a second-side gas inlet.

Example 57

The apparatus of any one of Example 54 to Example 56, wherein the first-side gas dispersion mechanism and the second-side gas dispersion mechanism are configured with an array of apertures or orifices around the periphery of each dispersion mechanism to direct incoming gases in a plane substantially parallel to faces of the substrate.

Example 58

The apparatus of any of the preceding Examples, wherein the front-side spray jet array and the back-side spray jet array are arranged to cover at least the entire diameter of the substrate on each face of the substrate thereby providing liquid to each entire face once the substrate has been rotated.

Example 59

A method for cleaning and drying a substrate in a substrate cleaning and drying mechanism, the substrate cleaning and drying mechanism having a single chamber for both cleaning and drying operations, where the method includes mounting a substrate vertically in the substrate cleaning and drying mechanism; rotating the substrate at a first rotational-velocity; spraying at least one liquid onto at least a first face of the substrate; spinning a first rotatable shield at a first-shield rotational-velocity; and spinning a second rotatable shield at a second-shield rotational-velocity; and drying the substrate by increasing the first rotational-velocity of the substrate.

Example 60

The method of Example 59, wherein a beginning of spraying at least one liquid onto at least a first face of the substrate occurs substantially simultaneously with rotating the substrate.

Example 61

The method of Example 59, wherein a beginning of spraying at least one liquid onto at least a first face of the substrate occurs after beginning the rotating of the substrate.

Example 62

The method of Example 59, wherein a beginning of spraying at least one liquid onto at least a first face of the substrate occurs before beginning the rotating of the substrate.

Example 63

The method of any one of Example 59 to Example 62, further comprising ramping up spinning the first rotatable shield and spinning of the second rotatable shield to a rotational-velocity from 0 to about 100 rpm during a low speed spin.

Example 64

The method of any one of Example 59 to Example 63, wherein the spraying of the at least one liquid onto at least a first face of the substrate is a continuous spray.

Example 65

The method of any one of Example 59 to Example 63, wherein the spraying of the at least one liquid onto at least a first face of the substrate is a pulsed spray.

Example 66

The method of any one of Example 59 to Example 65, wherein the at least one liquid includes at least one of deionized (DI) water and other liquid-based cleaning chemicals.

Example 67

The method of any one of Example 59 to Example 66, further comprising spraying liquids onto a second face of the substrate.

Example 68

The method of any one of Example 59 to Example 67, further comprising spraying liquids onto an edge of the substrate.

Example 69

The method of any one of Example 59 to Example 68, wherein the at least one liquid is sprayed onto the at least one face of the substrate prior to rotating the substrate at a first rotational velocity.

Example 70

The method of any one of Example 59 to Example 68, wherein the at least one liquid is sprayed onto the at least one face of the substrate subsequent to rotating the substrate at a first rotational velocity.

Example 71

The method of any one of Example 59 to Example 68, wherein the at least one liquid is sprayed onto the at least one face of the substrate during a time period of starting to rotate the substrate at a first rotational velocity.

Example 72

The method of any one of Example 59 to Example 71, wherein the first-shield rotational-velocity and the second-shield rotational-velocity are about the same as each other.

Example 73

The method of any one of Example 59 to Example 71, wherein the first-shield rotational-velocity and the second-shield rotational-velocity are different from one another.

Example 74

The method of any one of Example 59 to Example 73, wherein a direction of the first-shield rotational-velocity and a direction of the second-shield rotational-velocity are the same as each other.

Example 75

The method of any one of Example 59 to Example 73, wherein a direction of the first-shield rotational-velocity and a direction of the second-shield rotational-velocity are different from one another.

Example 76

The method of any one of Example 59 to Example 75, wherein the liquid, in the form of DI water, is sprayed into the chamber toward the substrate as a pulsed jet stream.

Example 77

The method of any one of Example 59 to Example 75, wherein the liquid, in the form of DI water, is sprayed into the chamber toward the substrate as a combination of a steady-state jet stream and a pulsed jet stream.

Example 78

The method of Example 77, wherein the liquid is sprayed into the chamber toward the substrate alternating between steady state and pulsed jets.

Example 79

The method of any one of Example 59 to Example 78, wherein at least the first rotatable shield is ramped up from about 0 rpm to about 100 rpm during a low speed spin.

Example 80

The method of any one of Example 59 to Example 79, further comprising increasing the first-shield rotational-velocity to begin drying the substrate.

Example 81

The method of any one of Example 59 to Example 80, further comprising increasing the second-shield rotational-velocity to begin drying the substrate.

Example 82

The method of any one of Example 59 to Example 81, wherein the first-shield rotational-velocity and the second-shield rotational-velocity are ramped up from about 100 rpm to about 2200 rpm during a high-speed spin to thy the substrate.

Example 83

The method of any one of Example 79 to Example 82, wherein the spraying of the at least one liquid onto at least a first face of the substrate is discontinued prior to increasing the first-shield rotational-velocity to begin drying the substrate or the increasing of the second-shield rotational-velocity to begin drying the substrate.

Example 84

The method of any one of Example 59 to Example 83, further comprising providing a gas exhaust from the substrate cleaning and drying mechanism during a cleaning cycle.

Example 85

The method of any one of Example 59 to Example 84, further comprising introducing a gas to disperse within the substrate cleaning and drying mechanism via gas dispersion mechanisms during the cleaning cycle.

Example 86

The method of Example 85, wherein a flowrate of the gas is less than about 575 lpm during the cleaning cycle.

Example 87

The method of any one of Example 59 to Example 83, further comprising introducing a gas to disperse within the substrate cleaning and drying mechanism via gas dispersion mechanisms during the drying cycle.

Example 88

The method of Example 87, wherein a flowrate of the gas is about 1700 to about 2300 lpm during the drying cycle.

Example 89

The method of any one of Example 85 to Example 88, wherein the gas dispersion mechanisms are for creating a low-pressure, high-velocity flow of gas proximate to the vertical substrate.

Example 90

The method of any one of Example 59 to Example 89, wherein the substrate is cleaned on alternate faces of the substrate.

Example 91

The method of any one of Example 59 to Example 89, wherein the substrate is cleaned on both faces of the substrate simultaneously.

Example 92

The method of any one of Example 59 to Example 89, wherein the substrate is cleaned on both faces and edges of the substrate simultaneously.

Example 93

The method of any one of Example 59 to Example 92, further comprising evacuating at least one or liquids and liquid vapors by various types of turbine blade mechanisms configured to withdraw liquids and vapors from the chamber.

Example 94

The method of any one of Example 59 to Example 93, further comprising introducing isopropyl alcohol (IPA) vapor with the high-purity gas into the chamber.

Example 95

The method of any one of Example 80 to Example 88, wherein a high-purity gas is dispensed into the chamber during the drying operations.

Example 96

The method of Example 95, wherein the high-purity gas is dispensed via a mushroom design to produce a low pressure, high flow of gas.

Example 97

The method of Example 95, wherein the high-purity gas is dispensed via an array of gas outlets coupled to the chamber.

Example 98

The method of Example 95, wherein the high-purity gas is dispensed via in the gas inlet tube producing a knife-edge shower of the gas in the inner chamber.

Example 99

The method of any one of Example 95 to Example 98, wherein the high-purity gas is nitrogen, $N_2$.

What is claimed is:

1. A substrate cleaning and drying apparatus, the apparatus comprising:
a vertical substrate holder configured to hold and rotate a substrate vertically at various speeds;
an inner shield and an outer shield configured to surround the vertical substrate holder during operation of the apparatus, the inner shield and the outer shield each having an angle on respective outermost peripheral edges to redirect one of more liquids including moisture and effluents away from the substrate through at least one type of exhaust including exhaust types including a center exhaust and a side exhaust, the respective outermost peripheral edges formed such that fluid droplets cannot collect above the substrate, each of the inner shield and the outer shield being configured to operate independently in at least one of rotational speed and direction from the other shield; and
a front-side spray jet array and a back-side spray jet array, each of the front-side spray jet array and the back-side spray jet array being configured to spray at least one fluid onto respective sides of the substrate and edges of the substrate substantially concurrently and while the substrate is held by the vertical substrate holder between the inner shield and the outer shield.

2. The apparatus of claim 1, further comprising an outer chamber to contain process effluents.

3. The apparatus of claim 2, wherein the outer chamber includes a drain channel to collect liquid evacuated from a vertical substrate cleaning and drying chamber.

4. The apparatus of claim 1, wherein the apparatus is configured to clean both faces of the substrate, as well as an edge of the substrate, substantially simultaneously.

5. The apparatus of claim 1, wherein at least one array of the front-side spray jet array and the back-side spray jet array includes spray jets arranged to deliver a continuous-liquid spray of one or more liquids to the substrate.

6. The apparatus of claim 1, wherein at least one array of the front-side spray jet array and the back-side spray jet array includes spray jets arranged to deliver a pulsed-liquid spray of one or more liquids to the substrate.

7. The apparatus of claim 1, wherein at least one array of the front-side spray jet array and the back-side spray jet array includes spray jets arranged to deliver at least one of continuous-liquid sprays and pulsed-liquid sprays of one or more liquids to the substrate.

8. The apparatus of claim 1, wherein at least one array of the front-side spray jet array and the back-side spray jet array includes spray jets arranged to deliver both continuous-liquid sprays and pulsed-liquid sprays of one or more liquids to the substrate.

9. The apparatus of claim 6, wherein the pulsed-liquid spray jets are considered as gasless pulsed-jets.

10. The apparatus of claim 9, further comprising a diaphragm pump to produce gasless pulsed-jets.

11. The apparatus of claim 10, further comprising a variable-frequency drive coupled to supply power to the diaphragm pump.

12. The apparatus of claim 11, wherein the variable-frequency drive is configured to operate in a 1 Hz to 10 Hz frequency range to produce atomized droplets from the spray jets.

13. A method for cleaning and drying a substrate in a substrate cleaning and drying mechanism, the substrate cleaning and drying mechanism having a single chamber for both cleaning and drying operations, the substrate cleaning and drying mechanism further having an inner shield and an outer shield configured to surround a vertical substrate holder during operation of the apparatus, the substrate cleaning and drying mechanism including a front-side spray jet array and a back-side spray jet array, each of the front-side spray jet array and the back-side spray jet array being configured to spray at least one fluid onto respective sides of the substrate and edges of the substrate substantially concurrently and while the substrate is held by the vertical substrate holder between the inner shield and the outer shield, the inner shield and the outer shield each having an angle on respective outermost peripheral edges to redirect one or more liquids including moisture and effluents away from the substrate through at least one type of exhaust including exhaust types including a center exhaust and a side exhaust, the respective outermost peripheral edges formed such that fluid droplets cannot collect above the substrate, the method comprising:

mounting a substrate vertically in the substrate cleaning and drying mechanism;

rotating the substrate at a first substrate rotational-velocity;

spraying at least one liquid onto at least a first face of the substrate;

spinning the inner shield at an inner shield rotational-velocity;

spinning the outer shield at an outer shield rotational-velocity;

drying the substrate by increasing the rotational-velocity of the substrate; and exhausting moisture and effluents from the substrate through the at least one type of exhaust.

14. The method of claim 13, further comprising spraying the at least one liquid onto both faces and an edge of the substrate substantially simultaneously.

15. The method of claim 13, wherein the inner shield rotational-velocity and the outer-shield rotational-velocity are about the same as each other.

16. The method of claim 13, wherein the inner shield rotational-velocity and the outer-shield rotational-velocity are different from one another.

17. The method of claim 13, wherein a direction of the inner shield rotational-velocity and a direction of the outer-shield rotational-velocity are the same as each other.

18. The method of claim 13, wherein a direction of the inner shield rotational-velocity and a direction of the outer-shield rotational-velocity are different from one another.

19. The method of claim 13, further comprising increasing the inner shield rotational-velocity to begin drying the substrate.

20. The method of claim 13, further comprising increasing the outer-shield rotational-velocity to being drying the substrate.

21. The method of claim 13, wherein the inner shield rotational-velocity and the outer-shield rotational-velocity are ramped up from about 100 rpm to about 2200 rpm during a high-speed spin to dry the substrate.

22. The method of claim 13, further comprising providing a gas exhaust from the substrate cleaning and drying mechanism during a cleaning cycle.

23. A substrate cleaning and drying apparatus, the apparatus comprising:

a vertical substrate holder configured to hold and rotate a substrate vertically at various speeds;

an inner shield and an outer shield configured to surround the vertical substrate holder during an operation of the apparatus, the inner shield and the outer shield each having an angle on respective outermost peripheral edges to redirect one or more liquids including moisture and effluents away from the substrate through at least one type of exhaust, the respective outermost peripheral edges formed such that fluid droplets cannot collect above the substrate, each of the inner shield and the outer shield being configured to operate independently from one another in at least one of rotational speed and direction from the other shield; and a front-side spray jet array and a back-side spray jet array, the front-side spray jet array and the back-side spray jet array are each configured to spray at least one fluid onto the substrate while the substrate is held by the vertical substrate holder between the inner shield and the outer shield, the front-side spray array is configured to spray fluid onto a first face of the substrate while the back-side spray array is configured to spray fluid onto a second, opposing face of the substrate.

24. The apparatus of claim 23, wherein the front-side spray jet array and the back-side spray jet array are configured to spray the at least one fluid onto the first face and the second, opposing face of the substrate and edges of the substrate substantially concurrently.

25. The apparatus of claim 23, wherein the substrate cleaning and drying apparatus has a center exhaust between the inner shield and the outer shield for removing effluents.

26. The apparatus of claim 23, wherein the substrate cleaning and drying apparatus has a side exhaust on at least one of the inner shield and the outer shield for removing effluents.

27. The apparatus of claim 23, wherein the respective outermost peripheral edges of the inner shield and the outer shield each have one or more angles.

28. The apparatus of claim 23, wherein the respective outermost peripheral edges of the inner shield and the outer shield are curved.

29. The apparatus of claim 23, wherein the front-side spray jet array and the back-side spray jet array are arranged to cover at least the entire diameter of the substrate on each face of the substrate thereby providing liquid to each entire face once the substrate has been rotated.

30. The apparatus of claim 23, further comprising one or more edge-jets to be directed separately at an edge of the substrate to perform edge cleaning.

* * * * *

UNITED STATES PATENT AND TRADEMARK OFFICE
CERTIFICATE OF CORRECTION

Page 1 of 2

PATENT NO. : 10,985,039 B2
APPLICATION NO. : 16/478337
DATED : April 20, 2021
INVENTOR(S) : Randhawa et al.

It is certified that error appears in the above-identified patent and that said Letters Patent is hereby corrected as shown below:

On the Title Page

Page 2, Column 2, item [56], Lines 41-42, delete "Subnanaometer-Level" and insert --Subnanometer-Level-- therefor Page 2, Column 2, item [56], Line 42, delete "Cleaning." and insert --Cleaning Mechanism.-- therefor Page 3, Column 1, item [56], Line 2, before "for", insert --Reasons--

In the Drawings

Sheet 7 of 25, Fig. 7, reference numeral 707, Line 1, delete "N2" and insert --$N_2$-- therefor In the Specification Column 3, Line 54, delete "200610174919" and insert --2006/0174919-- therefor Column 8, Line 47, delete "lie" and insert --be-- therefor Column 9, Line 7, delete "area" and insert --arm-- therefor Column 9, Line 16, before "$Al_2O_3$)", insert --(--

Column 9, Line 29, delete "Deirin®," and insert --Delrin®,-- therefor

Column 12, Line 36, delete "(frying" and insert --drying-- therefor

Column 12, Line 39, delete "(frying" and insert --drying-- therefor

Column 13, Line 60, after "rotation)", insert --is--

Signed and Sealed this
Twenty-seventh Day of July, 2021

Drew Hirshfeld
*Performing the Functions and Duties of the
Under Secretary of Commerce for Intellectual Property and
Director of the United States Patent and Trademark Office*

CERTIFICATE OF CORRECTION (continued)
U.S. Pat. No. 10,985,039 B2

Column 17, Line 24, delete "exhaust," and insert --exhaust-- therefor

Column 19, Line 47, before "i.e.,", insert --(--

Column 19, Line 67, delete "(frying" and insert --drying-- therefor

Column 22, Line 41, delete "1031" and insert --1301-- therefor

Column 23, Line 22, delete "toxoid," and insert --toroid,-- therefor

Column 24, Line 3, before "units", insert --(in--

Column 25, Line 4, delete "reacting" and insert --reading-- therefor

Column 26, Line 32, after "Groups", insert --III-V, II-VI,--

Column 27, Line 20, delete "art," and insert --art-- therefor

Column 31, Line 5, delete "±3"" and insert --±3°-- therefor

Column 36, Line 18, delete "thy" and insert --dry-- therefor

In the Claims

Column 38, Line 3, Claim 1, delete "of" and insert --or-- therefor

Column 39, Line 44, Claim 20, delete "being" and insert --begin-- therefor